(12) United States Patent
Huang et al.

(10) Patent No.: US 12,400,984 B2
(45) Date of Patent: *Aug. 26, 2025

(54) ISOLATION STRUCTURE FOR BOND PAD STRUCTURE

(71) Applicant: Taiwan Semiconductor Manufacturing Company, Ltd., Hsin-Chu (TW)

(72) Inventors: Sin-Yao Huang, Tainan (TW); Jeng-Shyan Lin, Tainan (TW); Shih-Pei Chou, Tainan (TW); Tzu-Hsuan Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/318,887

(22) Filed: May 17, 2023

(65) Prior Publication Data

US 2023/0290749 A1    Sep. 14, 2023

Related U.S. Application Data

(63) Continuation of application No. 17/236,360, filed on Apr. 21, 2021, now Pat. No. 11,694,979, which is a
(Continued)

(51) Int. Cl.
*H01L 23/00*   (2006.01)
*H01L 27/146*   (2006.01)
(Continued)

(52) U.S. Cl.
CPC .............. *H01L 24/08* (2013.01); *H01L 24/03* (2013.01); *H01L 24/05* (2013.01); *H10F 39/011* (2025.01);
(Continued)

(58) Field of Classification Search
CPC ... H01L 24/03; H01L 24/08; H01L 27/14636; H01L 27/1464; H01L 27/14645;
(Continued)

(56) References Cited

U.S. PATENT DOCUMENTS 9,035,445 B2   5/2015   Lin et al.
9,219,032 B2   12/2015   Ramachandran et al.
(Continued)

OTHER PUBLICATIONS

U.S. Appl. No. 16/558,556, filed Sep. 3, 2019.
(Continued)

*Primary Examiner* — Victoria K. Hall
(74) *Attorney, Agent, or Firm* — Eschweiler & Potashnik, LLC

(57) ABSTRACT

Various embodiments of the present disclosure are directed towards a method for forming an integrated chip including a substrate having an upper surface vertically below a top surface. A dielectric structure contacts the top surface of the substrate. A conductive structure is disposed in the substrate. The conductive structure includes an upper conductive body and conductive protrusions directly underlying the upper conductive body. The upper conductive body overlies the upper surface of the substrate. A bottom surface of the dielectric structure is disposed between a top surface and a bottom surface of the upper conductive body. An isolation structure is disposed in the substrate on opposing sides of the upper conductive body.

20 Claims, 21 Drawing Sheets

Related U.S. Application Data continuation of application No. 16/532,781, filed on Aug. 6, 2019, now Pat. No. 10,991,667.

(51) Int. Cl.
  *H10F 39/00* (2025.01)
  *H10F 39/12* (2025.01)
  *H10F 39/18* (2025.01)

(52) U.S. Cl.
  CPC ......... *H10F 39/014* (2025.01); *H10F 39/026* (2025.01); *H10F 39/182* (2025.01); *H10F 39/199* (2025.01); *H10F 39/807* (2025.01); *H10F 39/811* (2025.01); *H01L 24/13* (2013.01); *H01L 2224/02233* (2013.01); *H01L 2224/0225* (2013.01); *H01L 2224/02251* (2013.01); *H01L 2224/02255* (2013.01); *H01L 2224/0226* (2013.01); *H01L 2224/0345* (2013.01); *H01L 2224/03462* (2013.01); *H01L 2224/03464* (2013.01); *H01L 2224/0361* (2013.01); *H01L 2224/03622* (2013.01); *H01L 2224/0401* (2013.01); *H01L 2224/05553* (2013.01); *H01L 2224/05554* (2013.01); *H01L 2224/05557* (2013.01); *H01L 2224/05559* (2013.01); *H01L 2224/05571* (2013.01); *H01L 2224/05624* (2013.01); *H01L 2224/05647* (2013.01); *H01L 2224/13007* (2013.01); *H01L 2224/131* (2013.01); *H01L 2924/00014* (2013.01); *H01L 2924/053* (2013.01); *H10F 39/8053* (2025.01)

(58) Field of Classification Search
  CPC ......... H01L 27/14689; H01L 27/14621; H01L 27/14627; H10F 39/014; H10F 39/182; H10F 39/199; H10F 39/8053; H10F 39/8063; H10F 39/811
  See application file for complete search history.

(56) References Cited

U.S. PATENT DOCUMENTS

| | | | |
|---|---|---|---|
| 9,679,936 B2 | 6/2017 | Borthakur et al. | |
| 9,741,759 B2 | 8/2017 | Park | |
| 10,270,003 B2 | 4/2019 | Cheng | |
| 10,991,667 B2* | 4/2021 | Huang | H01L 24/03 |
| 11,217,547 B2* | 1/2022 | Chou | H01L 27/14621 |
| 11,222,915 B2 | 1/2022 | Hsu et al. | |
| 11,694,979 B2* | 7/2023 | Huang | H01L 27/14636 |
| | | | 257/734 |
| 12,341,115 B2* | 6/2025 | Chou | H01L 24/03 |
| 2012/0062777 A1* | 3/2012 | Kobayashi | H10F 39/18 |
| | | | 348/E5.091 |
| 2012/0068330 A1 | 3/2012 | Oganesian et al. | |
| 2012/0267745 A1* | 10/2012 | Tsuji | H01L 27/14621 |
| | | | 257/E31.127 |
| 2013/0009270 A1* | 1/2013 | Tsai | H10F 39/8057 |
| | | | 257/E31.124 |
| 2013/0032916 A1 | 2/2013 | Lin et al. | |
| 2013/0032920 A1 | 2/2013 | Lin et al. | |
| 2013/0037958 A1* | 2/2013 | Ho | H10F 39/199 |
| | | | 257/E23.079 |
| 2013/0235243 A1* | 9/2013 | Sano | H10F 39/199 |
| | | | 348/308 |
| 2013/0320475 A1* | 12/2013 | Takahashi | H10F 39/8053 |
| | | | 438/666 |
| 2014/0008757 A1* | 1/2014 | Ramachandran | H01L 23/481 |
| | | | 438/424 |
| 2014/0061839 A1* | 3/2014 | Ting | H10F 39/811 |
| | | | 438/70 |
| 2014/0061842 A1* | 3/2014 | Ting | H10F 39/026 |
| | | | 257/E31.124 |
| 2014/0094030 A1* | 4/2014 | Shimotsusa | H01L 21/76898 |
| | | | 438/652 |
| 2015/0179693 A1 | 6/2015 | Maruyama et al. | |
| 2015/0243699 A1* | 8/2015 | Borthakur | H01L 27/14636 |
| | | | 348/307 |
| 2015/0255495 A1 | 9/2015 | Park | |
| 2015/0318323 A1 | 11/2015 | Borthakur et al. | |
| 2016/0093661 A1* | 3/2016 | Hu | H10F 39/8053 |
| | | | 257/292 |
| 2016/0300962 A1 | 10/2016 | Borthakur et al. | |
| 2016/0365378 A1* | 12/2016 | Chiang | H10F 19/904 |
| 2016/0379960 A1 | 12/2016 | Huang et al. | |
| 2017/0040358 A1* | 2/2017 | Kim | H10F 39/811 |
| 2017/0047301 A1 | 2/2017 | Yang et al. | |
| 2017/0141146 A1* | 5/2017 | Belsher | H10F 39/199 |
| 2017/0287878 A1 | 10/2017 | Huang et al. | |
| 2017/0301715 A1 | 10/2017 | Cheng et al. | |
| 2018/0114807 A1* | 4/2018 | Yamagishi | H10F 39/12 |
| 2018/0240833 A1 | 8/2018 | Tai et al. | |
| 2019/0088705 A1* | 3/2019 | Wang | H10F 39/026 |
| 2019/0148439 A1* | 5/2019 | Shin | H10F 19/50 |
| | | | 257/443 |
| 2020/0373344 A1 | 11/2020 | Tung et al. | |
| 2021/0043593 A1* | 2/2021 | Huang | H01L 24/03 |

OTHER PUBLICATIONS

Non-Final Office Action dated Aug. 31, 2020 for U.S. Appl. No. 16/532,781.
Notice of Allowance dated Dec. 24, 2020 for U.S. Appl. No. 16/532,781.
Non-Final Office Action dated Sep. 19, 2022 for U.S. Appl. No. 17/236,360.
Notice of Allowance dated Feb. 24, 2023 for U.S. Appl. No. 17/236,360.
Non-Final Office Action dated Dec. 2, 2024 for U.S. Appl. No. 18/660,276.
Notice of Allowance dated Jun. 4, 2025 for U.S. Appl. No. 18/660,276.

* cited by examiner

ISOLATION STRUCTURE FOR BOND PAD STRUCTURE

REFERENCE TO RELATED APPLICATIONS

This Application is a Continuation of U.S. application Ser. No. 17/236,360, filed on Apr. 21, 2021 (now U.S. Pat. No. 11,694,979, issued Jul. 4, 2023), which is a Continuation of U.S. application Ser. No. 16/532,781, filed on Aug. 6, 2019 (now U.S. Pat. No. 10,991,667, issued on Apr. 27, 2021). The contents of the above-referenced Patent Applications are hereby incorporated by reference in their entirety.

BACKGROUND

Integrated circuits (ICs) with image sensors are used in a wide range of modern day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
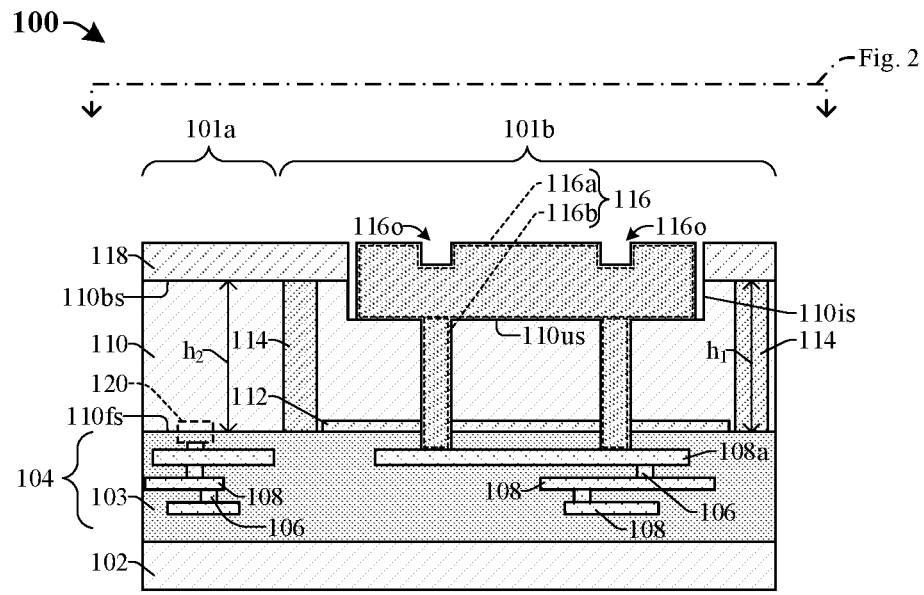
FIG. 1 illustrates a cross-sectional view of some embodiments of an integrated chip including a bond pad extending through a semiconductor substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips typically comprise a plurality of metal interconnect layers arranged along a front-side of a substrate. The plurality of metal interconnect layers are configured to electrically connect devices (e.g., transistors, photodetectors, etc.) arranged within the substrate together. Back-side illuminated CMOS image sensors (BSI-CISs) comprise photodetectors arranged within the substrate in proximity to a back-side of the substrate, so that the photodetectors are able to receive light along the back-side of the substrate. By receiving light along the back-side of the substrate, incident light does not traverse the plurality of metal interconnect layers, thereby increasing an optical efficiency of the photodetectors.

By virtue of the BSI-CISs receiving light along a back-side of a substrate, substrates having BSI-CIS are often placed within a packaging structure in a front-side down configuration that exposes the back-side of the substrate. Because the back-side of the substrate is exposed, bond pads are often arranged along the back-side of the substrate and are connected to metal interconnect layers. The bond pads may have a number of different configurations. For example, the bond pad may be disposed within a bond pad opening that extends through the front-side of the substrate to the back-side of the substrate. To electrically isolate the bond pad from the substrate, a dielectric structure is disposed along sidewalls of the substrate that define the bond pad opening. However, disposing the dielectric structure along the bond pad opening increases complexity, time, and cost associated with fabricating the BSI-CIS. Further, a top surface of the bond pad may be disposed below the back-side of the substrate. This may increase light received by the photodetectors; nevertheless this will decrease a reliability of a bond between the bond pad and another bonding structure. Furthermore, the bond pad may comprise an upper conductive segment extending over the back-side of the substrate, thereby increasing a reliability of the bond between the bond pad and another bonding structure. However, in such embodiments, the upper conductive segment may reflect light away from the photodetectors, thereby decreasing a reliability and/or a quality of images reproduced from the photodetectors.

Accordingly, in some embodiments, the present disclosure relates to an integrated chip including a bond pad isolation structure surrounding a bond pad. The integrated chip includes a plurality of photodetectors arranged within a substrate. A bond pad region extends through the substrate, at a location laterally offset from the photodetectors, to a metal interconnect wire arranged within an interconnect dielectric structure disposed along a front-side of the substrate. The bond pad is disposed within the bond pad region and extends from the front-side of the substrate to a back-side of the substrate and is electrically coupled to the metal interconnect wire. In some embodiments, the bond pad directly contacts an upper surface of the substrate and contacts sidewalls of the substrate. The bond pad isolation structure has a ring-shape and laterally surrounds the bond pad. Further, the bond pad isolation structure extends from the back-side to the front-side of the substrate, thereby electrically isolating the bond pad from devices (e.g., the photodetectors and/or transistors) disposed on and/or within the substrate. The bond pad contacting the substrate decreases complexity, time, and cost associated with forming the bond pad. Further, the bond pad isolation structure prevents "leakage" (i.e., a flow of current) from the bond pad to devices disposed on and/or within the substrate.

FIG. 1 illustrates a cross-sectional view of some embodiments of an integrated chip 100 having a bond pad 116 disposed within a bond pad region 101b.

The integrated chip 100 includes an interconnect structure 104 disposed along a front-side 110fs of a semiconductor substrate 110 (e.g., a silicon substrate). The interconnect structure 104 overlies a carrier substrate 102 (e.g., a silicon substrate), wherein the interconnect structure 104 is disposed between the semiconductor substrate 110 and the carrier substrate 102. The interconnect structure 104 includes a plurality of interconnect layers arranged within an interconnect dielectric structure 103. The plurality of interconnect layers alternate between conductive wires 108 and conductive vias 106. The conductive wires 108 are configured to provide a lateral connection (i.e., a connection parallel to an upper surface of the carrier substrate 102), whereas the conductive vias 106 are configured to provide for a vertical connection between adjacent conductive wires 108. The conductive wires 108 include an upper conductive wire layer 108a. A dielectric structure 118 overlies a back-side 110bs of the semiconductor substrate 110. A shallow trench isolation (STI) structure 112 is disposed within the semiconductor substrate 110 and extends along an upper surface of the interconnect dielectric structure 103.

The bond pad region 101b extends through the semiconductor substrate 110, at a location laterally offset from a device region 101a, to the upper conductive wire layer 108a. In some embodiments, the device region 101a includes one or more semiconductor devices 120 (e.g., transistor(s), resistor(s), varactor(s), etc.) and/or photodetectors (not shown) disposed within and/or on the semiconductor substrate 110. A bond pad 116 and a bond pad isolation structure 114 are disposed within the bond pad region 101b. The bond pad 116 includes an upper conductive body 116a and conductive protrusions 116b underlying the upper conductive body 116a. The upper conductive body 116a comprises a same material (e.g., aluminum copper) as the conductive protrusions 116b. In some embodiments, the upper conductive body 116a directly overlies and directly contacts an upper surface 110us of the semiconductor substrate 110. In such embodiments, the conductive protrusions 116b directly contact sidewalls of the semiconductor substrate 110 and extend from the upper conductive body 116a to the upper conductive wire layer 108a. Further, the upper conductive body 116a has sidewalls that define pad openings 116o overlying the conductive protrusions 116b. The bond pad 116 may be configured to electrically couple the one or more semiconductor devices 120 to another integrated chip (not shown). In some embodiments, the upper conductive body 116a is laterally offset from an inner sidewall 110is of the semiconductor substrate 110 by a non-zero distance.

A bond pad isolation structure 114 is laterally offset from and surrounds outer sidewalls of the bond pad 116. In some embodiments, the bond pad isolation structure 114 comprises a material (e.g., silicon dioxide) different from the semiconductor substrate 110. The bond pad isolation structure 114 may extend from the front-side 110fs to the back-side 110bs of the semiconductor substrate 110. In some embodiments, the bond pad isolation structure 114 has a height $h_1$ that is greater than or equal to a height $h_2$ of the semiconductor substrate 110. The bond pad isolation structure 114 is configured to electrically isolate the bond pad 116 from other devices (e.g., the semiconductor devices 120) and/or doped regions (not shown) disposed within and/or on the semiconductor substrate 110. This may mitigate and/or prevent a "leakage" (i.e., a flow of current) between the bond pad 116 and the other devices and/or doped regions disposed within and/or on the semiconductor substrate 110, thereby increasing a reliability and endurance of the integrated chip 100. Further, in some embodiments, when the bond pad 116 directly contacts the semiconductor substrate 110 complexity, cost, and time associated with forming the integrated chip 100 may be reduced.

Figure 2:
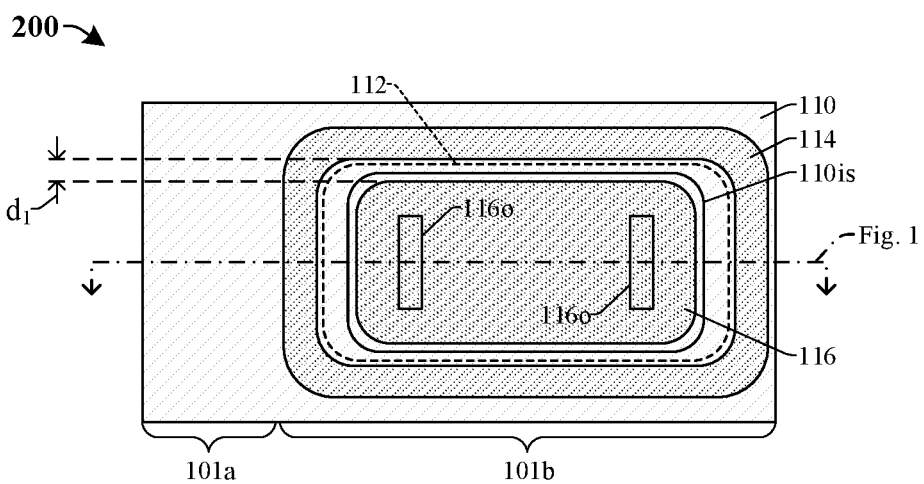
FIG. 2 illustrates a top view of some alternative embodiments of the IC of FIG. 1, as indicated by the cut-lines in FIGS. 1-2.

FIG. 2 illustrates a top view 200 of some alternative embodiments of the integrated chip 100 of FIG. 1, as indicated by the cut-lines in FIGS. 1 and 2. For ease of illustration, the dielectric structure 118 of FIG. 1 has been omitted from the top view 200 of FIG. 2.

As illustrated in FIG. 2, the bond pad isolation structure 114 has a ring like shape, where inner sidewalls of the bond pad isolation structure 114 completely surround outer sidewalls of the bond pad 116. The inner sidewalls of the bond pad isolation structure 114 are laterally offset from outer sidewalls of the bond pad isolation structure 114 by a distance $d_1$. In some embodiments, the distance $d_1$ is non-zero. When viewed from above, the bond pad isolation structure 114 has a rectangular/square shape with rounded edges; however the bond pad isolation structure 114 may have other shapes, such as a circular/elliptical shape. When viewed from above, the bond pad 116 has a rectangular/square shape with rounded edges; however the bond pad 116 may have other shapes, such as a circular/elliptical shape. In some embodiments, a shape of the bond pad isolation structure 114 corresponds to a shape of the bond pad 116. Further, the sidewalls of the bond pad 116 defining the pad openings 116o are laterally offset from one another by a non-zero distance. In some embodiments, a solder bump (not shown) may be disposed laterally between the pad openings 116o. When viewed from above, the pad openings 116o may, for example, have a square/rectangular shape. The bond pad isolation structure 114 continuously wraps around the outer sidewalls of the bond pad 116 and extends from the front-side (110fs of FIG. 1) to the back-side (110bs of FIG. 1) of the semiconductor substrate 110. Thus, the bond pad isolation structure 114 electrically isolates the bond pad 116 from other semiconductor devices and/or doped regions disposed within and/or on the semiconductor substrate 110. The STI structure 112 directly underlies the bond pad 116. In some embodiments, outer sidewalls of the bond pad 116 are laterally spaced between outer sidewalls of the STI structure 112.

Figure 3:
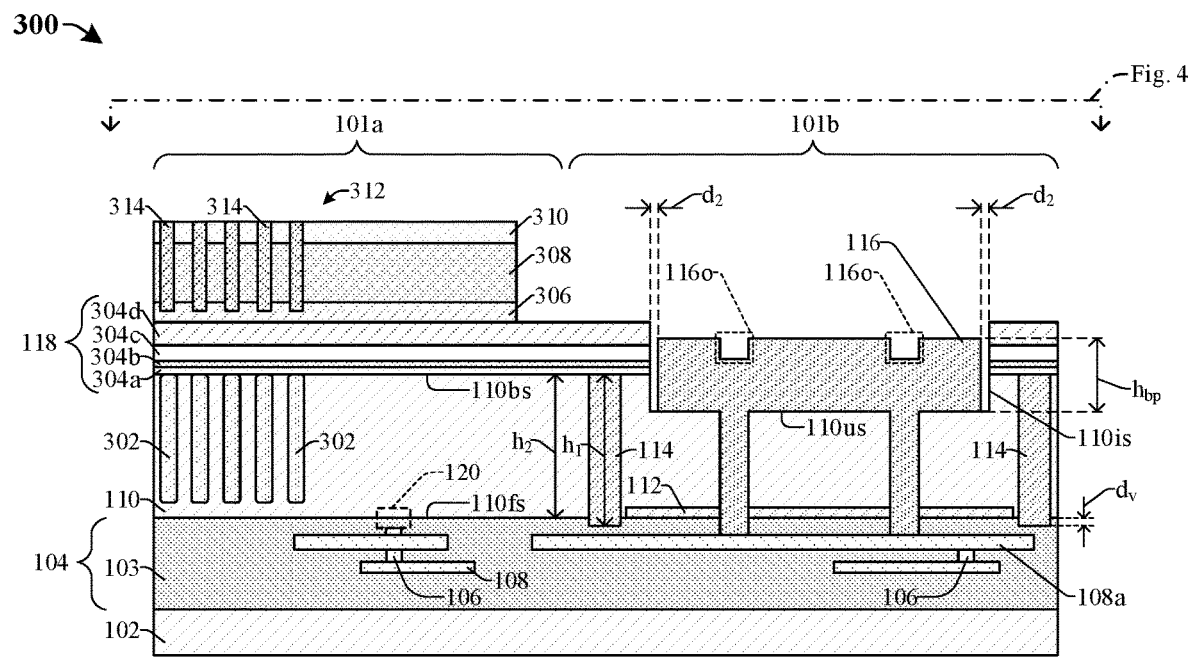
FIG. 3 illustrates a cross-sectional view of some embodiments of an image sensor including a bond pad laterally offset from a plurality of photodetectors.

FIG. 3 illustrates a cross-sectional view of some embodiments of an image sensor 300 including a bond pad 116 laterally offset from a plurality of photodetectors 302.

A semiconductor substrate 110 overlies a carrier substrate 102. In some embodiments, the semiconductor substrate 110 and/or the carrier substrate 102 may respectively, for example, be a bulk substrate (e.g., a bulk silicon substrate), a silicon-on-insulator (SOI) substrate, or some other suitable substrate. The plurality of photodetectors 302 are disposed within the semiconductor substrate 110. In some embodiments, the photodetectors 302 respectively extend from a back-side 110bs of the semiconductor substrate 110 to a point below the back-side 110bs. In further embodiments, the point is at a front-side 110fs of the semiconductor substrate 110, which is opposite the back-side 110bs of the semiconductor substrate 110. An interconnect structure 104 is disposed along the front-side 102fs of the semiconductor substrate 110. The interconnect structure 104 includes an interconnect dielectric structure 103, a plurality of conductive wires 108, and a plurality of conductive vias 106. The semiconductor substrate 110 is bonded to the carrier substrate 102 by way of the interconnect structure 104. In some embodiments, the conductive wires 108 and/or the conductive vias 106 may respectively, for example, be or comprise aluminum, copper, aluminum copper, tungsten, or the like. In some embodiments, the interconnect dielectric structure 103 may, for example, comprise one or more dielectric layers (e.g., silicon dioxide).

A dielectric structure 118 overlies the back-side 110bs of the semiconductor substrate 110. In some embodiments, the dielectric structure 118 includes one or more dielectric layers, such as a first dielectric layer 304a, a second dielectric layer 304b, a third dielectric layer 304c, and a fourth dielectric layer 304d. In some embodiments, the first dielectric layer 304a may, for example, be or comprise a metal oxide, such as aluminum oxide, or another suitable oxide. The second dielectric layer 304b may, for example, be or comprise a metal oxide, such as hafnium oxide, or another suitable oxide. The third dielectric layer 304c may, for example, be or comprise a metal oxide, such as tantalum oxide, or another suitable oxide. The fourth dielectric layer 304d may, for example, be or comprise an oxide, such as silicon dioxide, another suitable oxide, undoped silicon glass (USG), polysilicon, another suitable dielectric and/or may have a thickness within a range of about 500 to 3,000 Angstroms. The dielectric structure 118 may be configured to protect the back-side 110bs of the semiconductor substrate 110.

An etch stop layer 306 overlies the dielectric structure 118. A first grid layer 308 overlies the etch stop layer 306, and a second grid layer 310 overlies the first grid layer 308. A grid structure 312 includes a segment of the first and second grid layers 308, 310 vertically above the photodetectors 302. The grid structure 312 is laterally around and between the photodetectors 302 to define a plurality of color filter openings. A plurality of color filters 314 are arranged within the plurality of color filter openings and overlies the plurality of photodetectors 302. The grid structure 312 comprises a dielectric material with a refractive index less than a refractive index of the color filters 314. Due to the lower refractive index, the grid structure 312 serves as a radiation guide to direct incident electromagnetic radiation (i.e., light) to a corresponding photodetector 302. Further, the color filters 314 are respectively configured to block a first range of frequencies of the incident electromagnetic radiation while passing a second range of frequencies (different than the first range of frequencies) of the incident electromagnetic radiation to an underlying photodetector 302.

In some embodiments, the etch stop layer 306 may, for example, be or comprise silicon carbide, silicon nitride, or the like and/or may have a thickness of about 1,500 Angstroms. In some embodiments, the first grid layer 308 may, for example, be or comprise an oxide, such as silicon dioxide, or another suitable oxide and/or may have a thickness of about 5,600 Angstroms. In further embodiments, the second grid layer 310 may, for example, be or comprise an oxide, such as silicon-oxy-nitride, or another suitable oxide and/or may have a thickness of about 1,500 Angstroms. In yet further embodiments, the first grid layer 308 may be or comprise a metal such as tungsten, another suitable metal, or the like. In such embodiments, the grid structure 312 may be configured as a composite grid structure comprising one or more metal layers and one or more dielectric layers. In further embodiments, the grid structure 312 may be configured as a dielectric grid structure comprising one or more dielectric layers.

One or more semiconductor devices 120 (e.g., transistor(s), resistor(s), etc.) may be disposed within and/or on the front-side 110fs of the semiconductor substrate. In such embodiments, the one or more semiconductor devices 120 may, for example, be pixel devices, such as a transfer transistor, a source follower transistor, a reset transistor, etc. The one or more semiconductor devices 120, the photodetectors 302, and the grid structure 312 are laterally arranged within a device region 101a of the image sensor 300. The device region 101a is laterally offset from a bond pad region 101b of the image sensor 300. A bond pad 116 and a bond pad isolation structure 114 are laterally arranged within the bond pad region 101b of the image sensor 300. Thus, in some embodiments, the bond pad 116 and the bond pad isolation structure 114 are laterally offset from the photodetectors 302 and/or the one or more semiconductor devices 120 by a non-zero distance.

The bond pad 116 is configured to electrically coupled the one or more semiconductor devices 120 and/or the photodetectors 302 to another integrated chip (not shown) by way of the interconnect structure 104. In some embodiments, the bond pad 116 directly contacts an upper surface 110us of the semiconductor substrate 110 and has protrusions extending through the semiconductor substrate 110 to the upper conductive wire layer 108a. In such embodiments, the protrusions directly contact sidewalls of the semiconductor substrate 110 disposed below the upper surface 110us of the semiconductor substrate 110. The protrusions extend through a shallow trench isolation (STI) structure 112 and the interconnect dielectric structure 103. Further, the bond pad 116 has sidewalls that define pad openings 116o overlying the protrusions of the bond pad 116. In further embodiments, the bond pad 116 is laterally offset upper sidewalls of the semiconductor substrate 110 and sidewalls of the dielectric structure 118 by a distance $d_2$. In some embodiments, the distance $d_2$ is non-zero, such that the bond pad 116 is may be electrically isolated from the dielectric structure 118. Further, in such embodiments, by virtue of the non-zero distance $d_2$, upper sidewalls of the semiconductor substrate 110 and/or sidewalls of the dielectric structure 118 may be protected from a bonding process performed on the bond pad 116 (i.e., from a downward force applied to the bond pad 116). This may increase a structural integrity of the image sensor 300. In some embodiments, a top surface of the bond pad 116 is aligned with a top surface of the dielectric structure 118 (not shown) (e.g., see FIG. 5). The bond pad has a bond pad height hep defined from the upper surface 110us of the semiconductor substrate 110 to the top surface of the bond pad 116. In some embodiments, the bond pad height hep is about 12,000 Angstroms.

The bond pad isolation structure 114 laterally surrounds the bond pad 116, wherein the bond pad isolation structure 114 extends from the back-side 110bs of the semiconductor to a point below the front-side 110fs. Thus, the bond pad isolation structure 114 electrically isolates the bond pad 116 from the one or more semiconductor device 120 and/or the photodetectors 302, thereby preventing a "leakage" (i.e., a flow of current) between the bond pad 116 and the adjacent devices. This increases a performance, stability, and reliability of the image sensor 300. The bond pad isolation structure 114 has a height $h_1$ that is greater than a height $h_2$ of the semiconductor substrate 110. A bottom surface of the bond pad isolation structure 114 is vertically below the front-side 110fs of the semiconductor substrate 110 by a distance $d_v$. In some embodiments, the distance $d_v$ is non-zero, wherein the bond pad isolation structure 114 extends into the interconnect dielectric structure 103. In some embodiments, if the bottom surface of the bond pad isolation structure 114 is above the front-side 110fs (i.e., the distance $d_v$ is negative and/or the height $h_1$ is less than the height $h_2$) then "leakage" may occur between the bond pad 116 and the one or more semiconductor devices 120 and/or the photodetectors 302, thereby decreasing a performance of the image sensor 300. The bond pad isolation structure 114 may, for example, be or comprise an oxide, such as silicon dioxide, or silicon nitride, silicon oxynitride, or the like.

Figure 4:
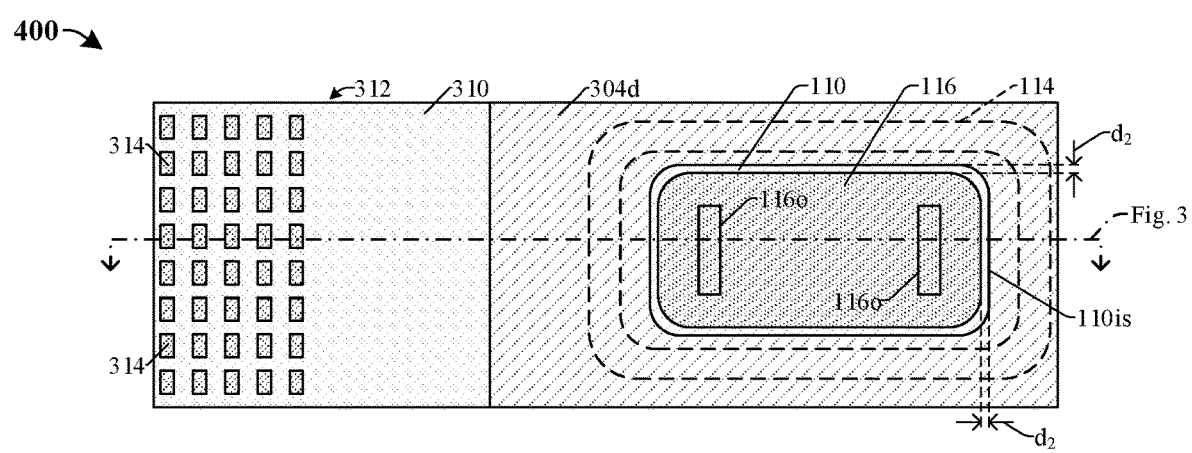
FIG. 4 illustrates a top view of some alternative embodiments of the image sensor of FIG. 3, as indicated by the cut-lines in FIGS. 3-4.

FIG. 4 illustrates a top view 400 of some alternative embodiments of the image sensor 300 of FIG. 3, as indicated by the cut-lines in FIGS. 3 and 4.

As illustrated in FIG. 4, the bond pad isolation structure 114 has a ring like shape, where inner sidewalls of the bond pad isolation structure 114 completely surround outer sidewalls of the bond pad 116. The outer sidewalls of the bond pad 116 are laterally offset from an inner sidewall 110is of the semiconductor substrate 110 by a distance $d_2$. In some embodiments, the distance $d_2$ is non-zero. The color filters 314 are arrange in an array comprising rows and columns and respectively overlie the photodetectors (302 of FIG. 3). In some embodiments, when viewed from above, the color filters 314 respectively have a rectangular/square shape and/or a circular/elliptical shape (not shown).

Figure 5:
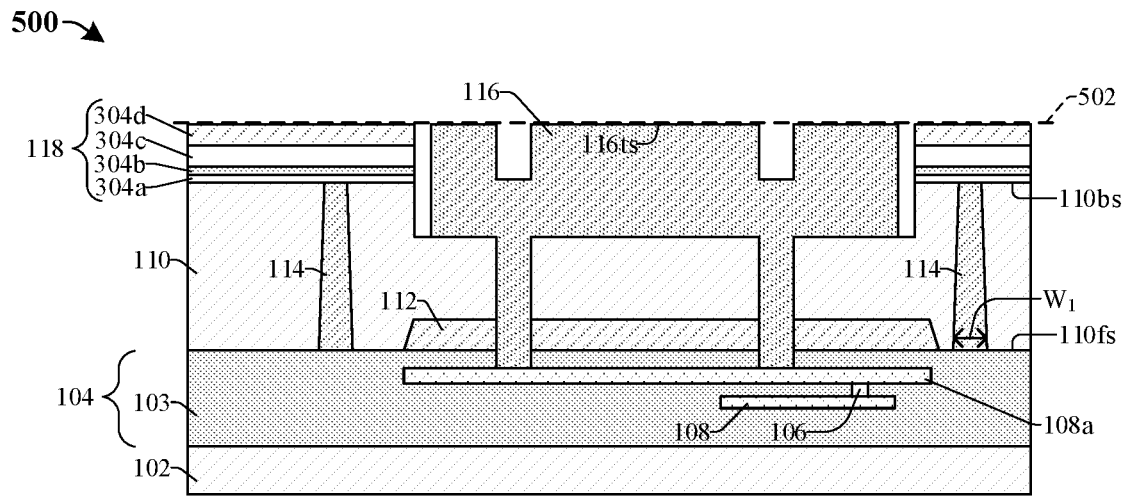
FIGS. 5, 6A, 6B, 7, and 8 illustrate cross-sectional views of some alternative embodiments of a bond pad isolation structure surrounding a bond pad.

FIG. 5 illustrates a cross-sectional view of some alternative embodiments of an integrated chip 500 having a bond pad 116 surrounded by a bond pad isolation structure 114.

A top surface 116ts of the bond pad 116 and a top surface of the dielectric structure 118 are respectively aligned along a substantially straight line 502. In some embodiments, the substantially straight line 502 is parallel to the back-side 110bs of the semiconductor substrate 110. In further embodiments, the top surface 116ts of the bond pad 116 is above the top surface of the dielectric structure 118 (not shown). Further, the bond pad isolation structure 114 has slanted sidewalls, wherein a width $W_1$ of the bond pad isolation structure 114 continuously increases from the back-side 110bs of the semiconductor substrate 110 to the front-side 110fs of the semiconductor substrate 110. In such embodiments, during a formation of the integrated chip 500, the bond pad isolation structure 114 may, for example, have been formed concurrently with the STI structure 112, or after forming the STI structure 112 and before forming the interconnect structure 104. In some embodiments, for example, the substantially straight line 502 is configured as a level horizontal line. In further embodiments, the substantially straight line 502 may vary within a range of −25 to 25 Angstroms or within a range of −5 to 5 Angstroms from a level horizontal line disposed along the top surface 116ts of the bond pad 116. In yet further embodiments, an angle is defined between a first point disposed along the substantially straight line 502 and a second point disposed along the substantially straight line 502, where the first point is laterally offset from the second point, and the angle is about 180 degrees.

Figure 6A:
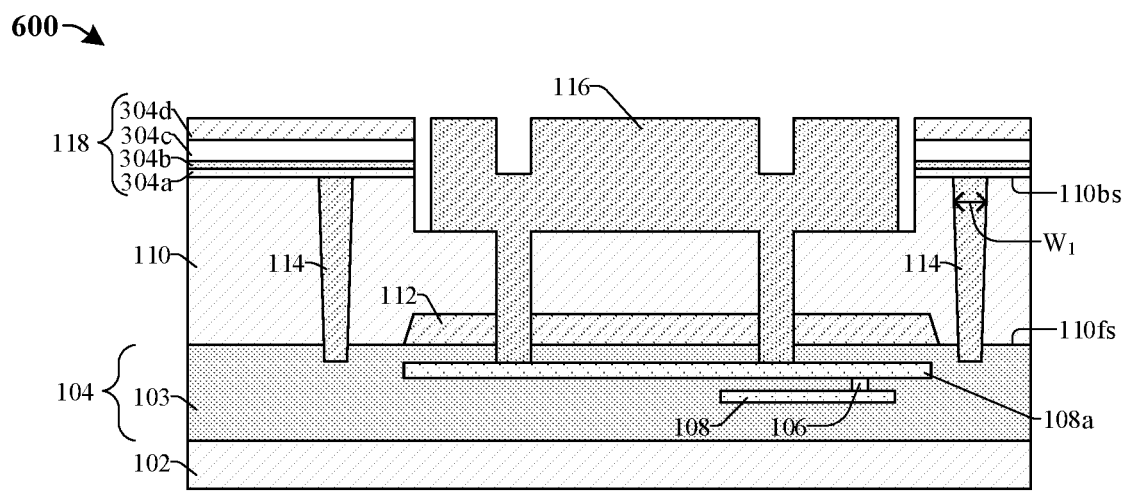

FIG. 6A illustrates a cross-sectional view of some alternative embodiments of an integrated chip 600 having a bond pad 116 surrounded by a bond pad isolation structure 114.

The bond pad isolation structure 114 extends from the back-side 110bs of the semiconductor substrate 110 to a point below the front-side 110fs of the semiconductor substrate 110. In some embodiments, a bottom surface of the bond pad isolation structure 114 may be aligned with the front-side 110fs of the semiconductor substrate 110 (not shown). The bond pad isolation structure 114 has slanted sidewalls, wherein a width $W_1$ of the bond pad isolation structure 114 continuously decreases from the back-side 110bs of the semiconductor substrate 110 to the front-side 110fs of the semiconductor substrate 110. In such embodiments, during a formation of the integrated chip 600, the bond pad isolation structure 114 may, for example, have been formed after forming the interconnect structure 104.

Figure 6B:
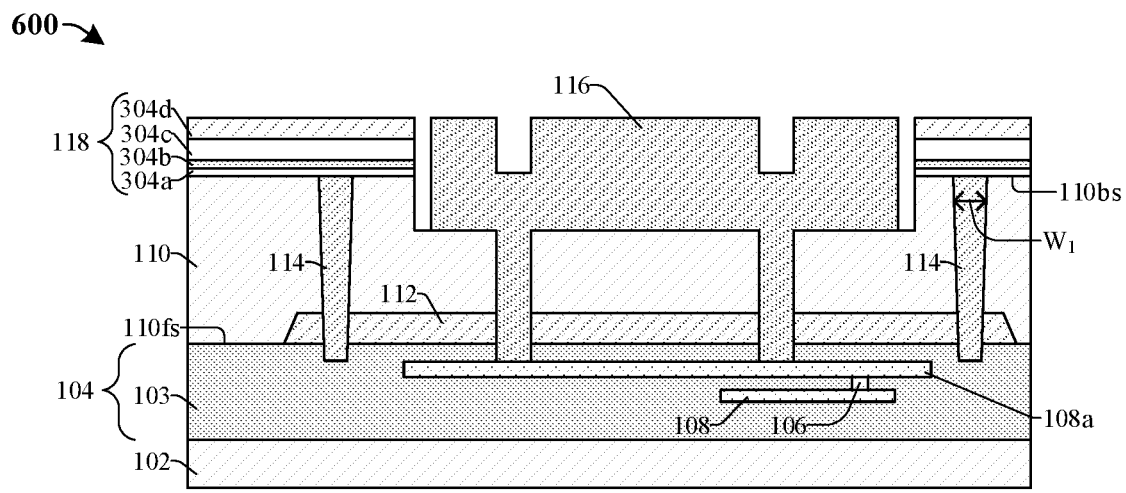

FIG. 6B illustrates a cross-sectional view of some alternative embodiments of the integrated chip 600 of FIG. 6A, where the bond pad isolation structure 114 is spaced laterally between outer sidewalls of the STI structure 112.

Figure 7:
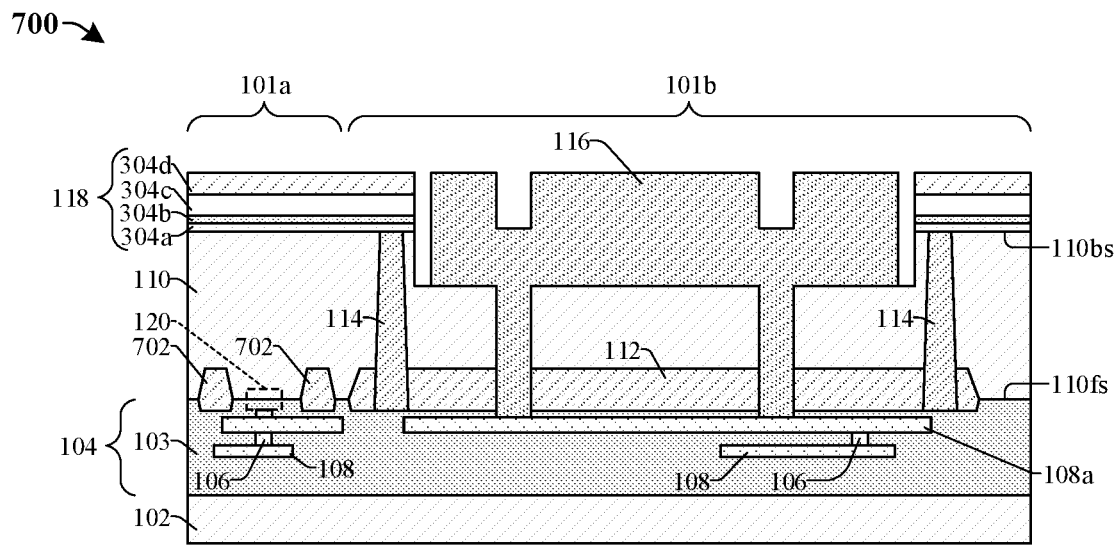

FIG. 7 illustrates a cross-sectional view of some alternative embodiments of an integrated chip 700 having a device region 101a laterally offset from a bond pad region 101b.

A device STI structure 702 is disposed within the device region 101a, wherein the device STI structure 702 comprises a same material as the STI structure 112. In some embodiments, the device STI structure 702 has a bottom surface and a top surface that are respectively aligned with a bottom surface and a top surface of the STI structure 112. In further embodiments, the device STI structure 702 has a ring-shape and surrounds at least one semiconductor device 120 disposed within and/or on the semiconductor substrate 110. The device STI structure 702 may further increase an electrical isolation between the semiconductor device 120 and the bond pad 116. Further, a bottom surface of the bond pad isolation structure 114 is aligned with the bottom surface of the STI structure 112 and/or the bottom surface of the device STI structure 702. In some embodiments, the STI structure 112 continuously extends between outer sidewalls of the bond pad isolation structure 114, wherein the STI structure 112 further increases electrical isolation between the bond pad 116 and other devices disposed on and/or within the semiconductor substrate 110 (e.g. the semiconductor device 120, photodetectors (not shown), etc.). In further embodiments, the STI structure 112 and the bond pad isolation structure 114 comprise a same material, wherein the bond pad isolation structure 114 is a protrusion of the STI structure 112.

Figure 8:
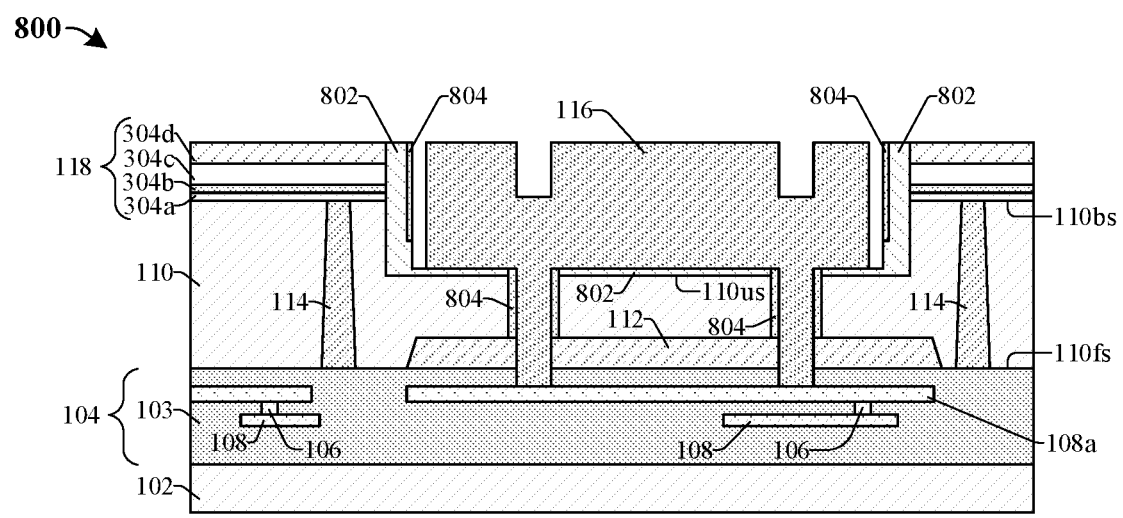

FIG. 8 illustrates a cross-sectional view of some alternative embodiments of an integrated chip 800 having a bond pad isolation structure 114 disposed around a bond pad 116.

A first insulator layer 802 is disposed along sidewalls of the dielectric structure 118 and sidewalls of the semiconductor substrate 110. The first insulator layer 802 is disposed between the bond pad 116 and the upper surface 110us of the semiconductor substrate 110. The bond pad 116 includes a conductive body disposed above the upper surface 110us of the semiconductor substrate 110, and conductive protrusions extending from the conductive body to the upper conductive wire layer 108a. A second insulator layer 804 is disposed along sidewalls of the first insulator layer 802 and along sidewalls of the protrusions of the bond pad 116. The second insulator layer 804 is disposed between sidewalls of the semiconductor substrate 110 and the protrusions of the bond pad 116, wherein the second insulator layer 804 continuously extends around the respective protrusions. The first and second insulator layers 802, 804 are respectively configured to electrically isolate the bond pad 116 from the semiconductor substrate 110. This further increases a performance and reliability of the integrated chip 800. In some embodiments, the first insulator layer 802 may, for example, be or comprise an oxide, such as silicon dioxide, undoped silicon glass silicon dioxide (USGOX), another suitable oxide, or the like. In some embodiments, the second insulator layer 804 may, for example, be or comprise an oxide, such as silicon dioxide, USGOX, another suitable oxide, or the like.

FIGS. 9-21 illustrate cross-sectional views 900-2100 of some embodiments of a first method of forming an integrated chip including a bond pad isolation structure surrounding a bond pad according to aspects of the present disclosure. Although the cross-sectional views 900-2100 shown in FIGS. 9-21 are described with reference to a first method, it will be appreciated that the structures shown in FIGS. 9-21 are not limited to the method but rather may stand alone separate of the method. Although FIGS. 9-21 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 9:
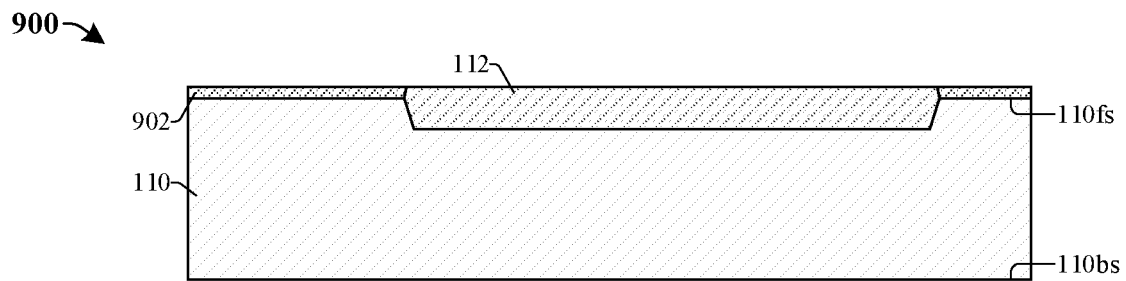
FIGS. 9-21 illustrate a series of cross-sectional views of some embodiments of a first method for forming a bond pad isolation structure surrounding a bond pad.

As shown in cross-sectional view 900 of FIG. 9, a semiconductor substrate 110 is provided and a masking layer 902 is formed on a front-side 110fs of the semiconductor substrate 110. In some embodiments, the semiconductor substrate 110 may, for example, be a bulk substrate (e.g., a bulk silicon substrate), a silicon-on-insulator (SOI) substrate, or some other suitable substrate. A shallow trench isolation (STI) structure 112 is formed on the front-side 110fs of the semiconductor substrate 110. In some embodiments, a process for forming the STI structure 112 may include: selectively etching the semiconductor substrate 110 to form a trench that extends into in the front-side 110fs of the semiconductor substrate 110; and filling (e.g., by chemical vapor deposition (CVD), physical vapor deposition (PVD), atomic layer deposition (ALD), thermal oxidation, etc.) the trench with a dielectric material (e.g., silicon dioxide, silicon carbide, etc.). In further embodiments, the semiconductor substrate 110 is selectively etched by exposing unmasked portions of the semiconductor substrate 110 to one or more etchants configured to selectively remove unmasked portions of the semiconductor substrate 110. The masking layer 902 may, for example, be or comprise silicon-oxy-nitride.

Figure 10:
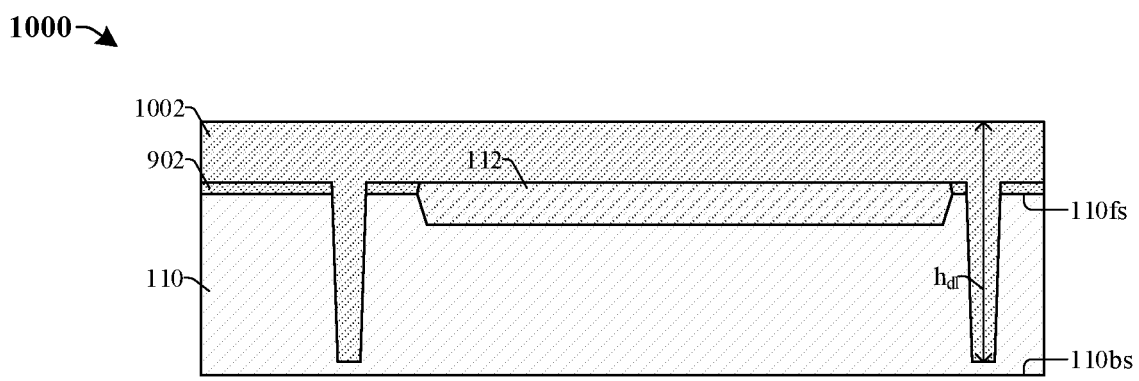

As shown in cross-sectional view 1000 of FIG. 10, a deep trench isolation (DTI) layer 1002 is formed over and into the semiconductor substrate 110. In some embodiments, a process for forming the DTI layer 1002 includes: forming a second masking layer over the masking layer 902 and the STI structure 112; patterning the semiconductor substrate 110 and the masking layer 902 according to the second masking layer, thereby forming DTI openings in the semiconductor substrate 110; forming (e.g., by a plasma-enhanced CVD (PECVD) process, a high aspect ratio process (HARP), PVD, or another suitable deposition process) a DTI material (e.g., silicon oxide, silicon nitride, silicon oxynitride, plasma-enhanced oxide (PEOX), another suitable dielectric material, or the like) over the semiconductor substrate 110, wherein the DTI material fills the DTI openings. In some embodiments, forming the DTI material includes forming a first dielectric layer (e.g., comprising silicon oxide) over a second dielectric layer (e.g., comprising silicon nitride), the second dielectric layer lines the DTI openings and the first dielectric layer fills a remaining portion of the DTI openings. In some embodiments, a bottom surface of the DTI layer 1002 is disposed above a back-side 110bs of the semiconductor substrate 110. In some embodiments, the DTI layer 1002 is formed by, for example, CVD, PVD, ALD, or another suitable deposition process. In some embodiments, the DTI layer 1002 has a height hal within a range of about 12,000 to 15,000 Angstroms or greater than 20,000 Angstroms.

Figure 11:
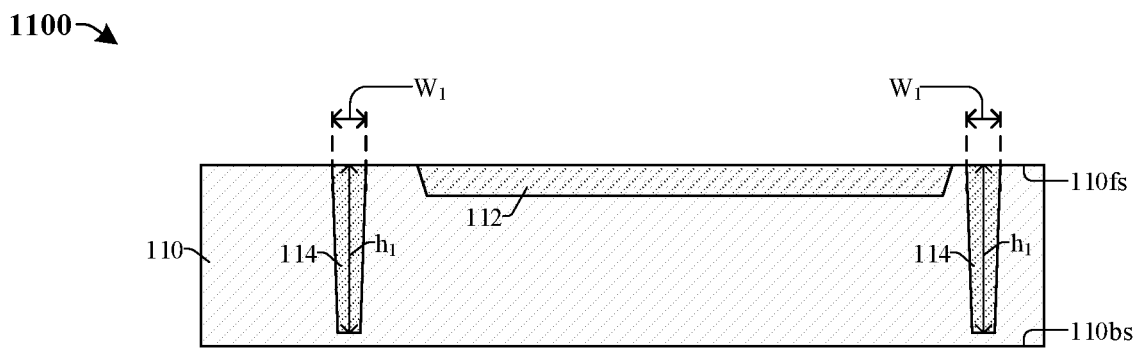

As shown in cross-sectional view 1100 of FIG. 11, a planarization process is performed on the DTI layer (1002, FIG. 10), thereby defining a bond pad isolation structure 114. In some embodiments, the planarization process includes performing a chemical-mechanical planarization (CMP) on the DTI layer (1002, FIG. 10) and/or the STI structure 112 until the front-side 110fs of the semiconductor substrate 110 is reached. In further embodiments, the planarization process may remove the masking layer 902. In some embodiments, after performing the planarization process the bond pad isolation structure 114 has a height $h_1$ that is greater than 2 micrometers. In further embodiments, a width $W_1$ of the bond pad isolation structure 114 continuously decreases from the front-side 110fs to a point above the back-side 110bs of the semiconductor substrate 110.

In some embodiments, the planarization process includes performing a CMP on the DTI layer (1002, FIG. 10) until a top surface of the STI structure 112 is exposed, thereby defining the bond pad isolation structure 114 (not shown). In such embodiments, an upper surface of the STI structure 112 and an upper surface of the bond pad isolation structure 114 are respectively vertically offset from the front-side 110fs of the semiconductor substrate 110, as illustrated in the cross-sectional view of FIG. 7. Further, in such embodiments, after performing the planarization a removal process is performed to remove the masking layer 902 (not shown).

Figure 12:
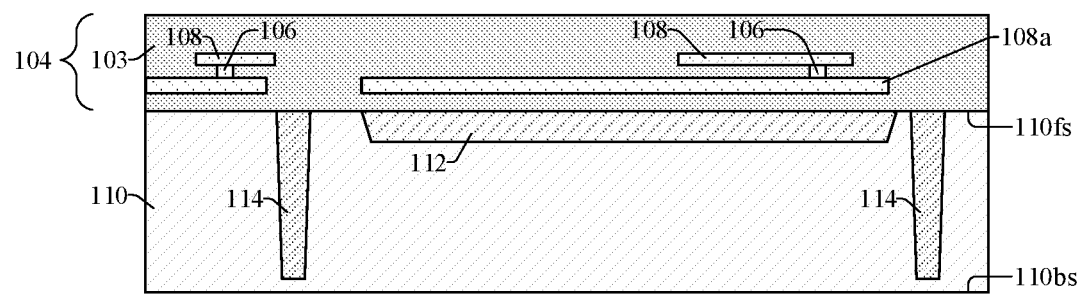

As shown in cross-sectional view 1200 of FIG. 12, an interconnect structure 104 is formed on the front-side 110fs of the semiconductor substrate 110. The interconnect structure 104 includes an interconnect dielectric structure 103, a plurality of conductive wires 108, and a plurality of conductive vias 106. In some embodiments, the interconnect dielectric structure 103 may be or comprise one or more inter-level dielectric (ILD) layers. The one or more ILD layers may, for example, be or comprise an oxide, such as silicon dioxide, or another suitable oxide. In some embodiments, a process for forming the interconnect structure 104 includes forming the conductive vias 106 and the conductive wires 108 by a single damascene process or a dual damascene process. For example, a first layer of the conductive vias 106 and a first layer of the conductive wires 108 may respectively be formed by a single damascene process. Further, in such embodiments, the process includes forming remaining layers of the conductive wires 108 and the conductive vias 106 by repeatedly performing a dual damascene process. In some embodiments, the conductive wires 108 and/or the conductive vias 106 may respectively, for example, be or comprise aluminum, copper, aluminum copper, tungsten, or the like.

Figure 13:
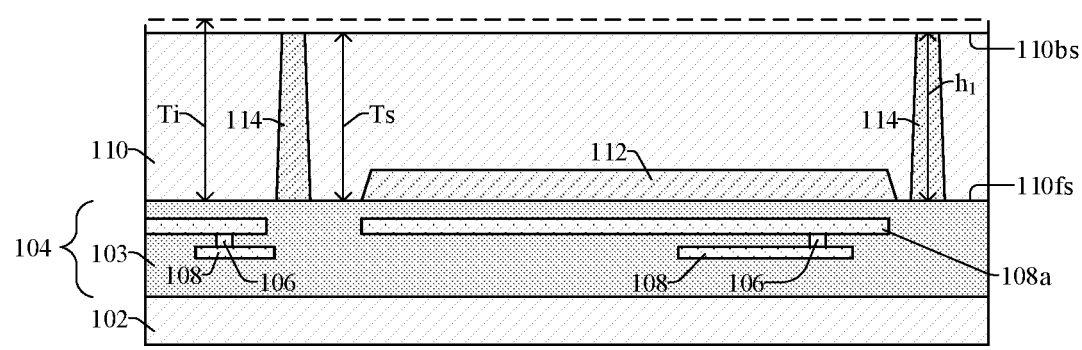

As shown in cross-sectional view 1300 of FIG. 13, the structure of FIG. 12 is rotated 180 degrees and the interconnect structure 104 is bonded to a carrier substrate 102. In some embodiments, the bonding process may comprise a fusion bonding process. In some embodiments, the carrier substrate 102 may, for example, be a bulk substrate (e.g., a bulk silicon substrate), a silicon-on-insulator (SOI) substrate, or some other suitable substrate. In some embodiments, after performing the bonding process, a thinning process is performed on the semiconductor substrate 110 until the bond pad isolation structure 114 is exposed. In such embodiments, the thinning process reduces an initial thickness $T_i$ of the semiconductor substrate to a thickness $T_s$. In some embodiments, the thickness $T_s$ is equal to the height $h_1$ of the bond pad isolation structure 114. In further embodiments, the thinning process is performed by a mechanical grinding process, a CMP, some other thinning process, or any combination of the foregoing. For example, the thinning process may be performed wholly by a mechanical grinding process.

Figure 14:
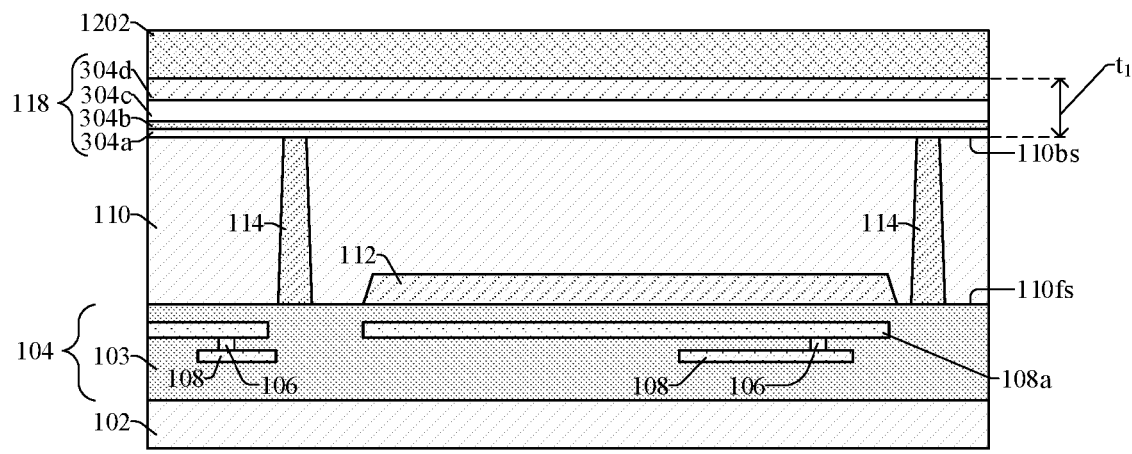

As shown in cross-sectional view 1400 of FIG. 14, a dielectric structure 118 is formed over the back-side 110*bs* of the semiconductor substrate 110. In some embodiments, the dielectric structure 118 includes one or more dielectric layers, such as a first dielectric layer 304*a*, a second dielectric layer 304*b*, a third dielectric layer 304*c*, and a fourth dielectric layer 304*d*. In some embodiments, the first dielectric layer 304*a*, the second dielectric layer 304*b*, the third dielectric layer 304*c* and/or the fourth dielectric layer 304*d* may respectively be formed by CVD, PVD, ALD, or another suitable deposition process. In further embodiments, the first, second, third, and fourth dielectric layers 304*a-d* may respectively comprise a dielectric material different from one another. For example, the first dielectric layer 304*a* may comprise aluminum oxide, the second dielectric layer 304*b* may comprise hafnium oxide, the third dielectric layer 304*c* may comprise tantalum oxide, and the fourth dielectric layer 304*d* may comprise silicon dioxide. The fourth dielectric layer 304*d* may, for example, have a thickness of about 1,300 Angstroms. Further, a dielectric protection layer 1202 is formed over the dielectric structure 118. The dielectric protection layer 1202 may comprise an oxide (such as silicon dioxide) and/or may act as a hard mask protection layer for the dielectric structure 118 during subsequent processing steps. In some embodiments, the dielectric protection layer 1202 may, for example, have a thickness of about 4,500 Angstroms. In such embodiments, the thickness of the dielectric protection layer 1202 is sufficiently large (e.g., about 4,500 Angstroms), such that a thickness of the fourth dielectric layer is not reduced during subsequent processing steps (e.g., the first etch process of FIG. 15 and/or the second etch process of FIG. 16). In some embodiments, the dielectric structure 118 has a thickness $t_1$ of about 2,000 Angstroms.

Figure 15:
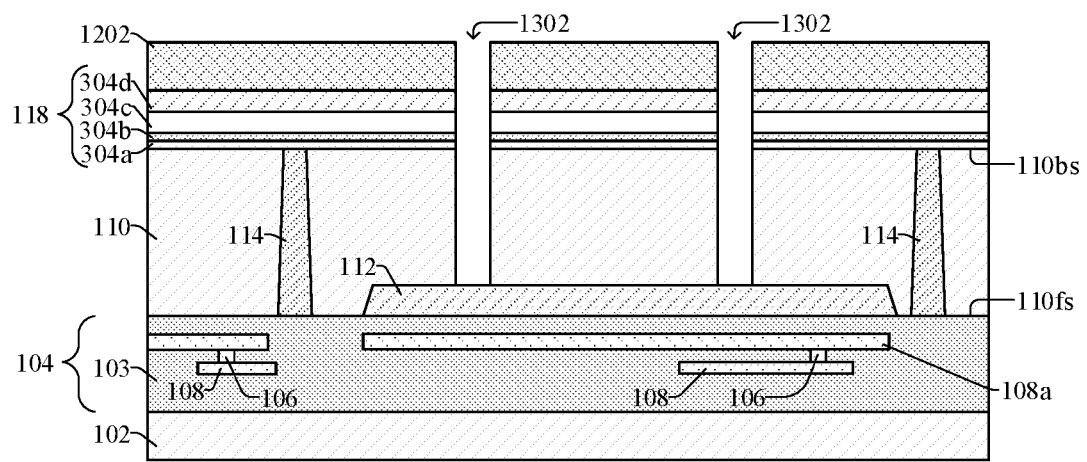

As shown in cross-sectional view 1500 of FIG. 15, a first etch process is performed on the dielectric protection layer 1202, the dielectric structure 118, and the semiconductor substrate 110, thereby forming plug openings 1302. In some embodiments, the first etch process may include performing a wet etch process, a dry etch process, or another suitable etch process. In some embodiments, the first etch process includes: forming a masking layer (not shown) over the dielectric protection layer 1202; exposing unmasked regions of the dielectric protection layer 1202 and underlying layers to one or more etchants, thereby defining the plug openings 1302; and performing a removal process to remove the masking layer.

Figure 16:
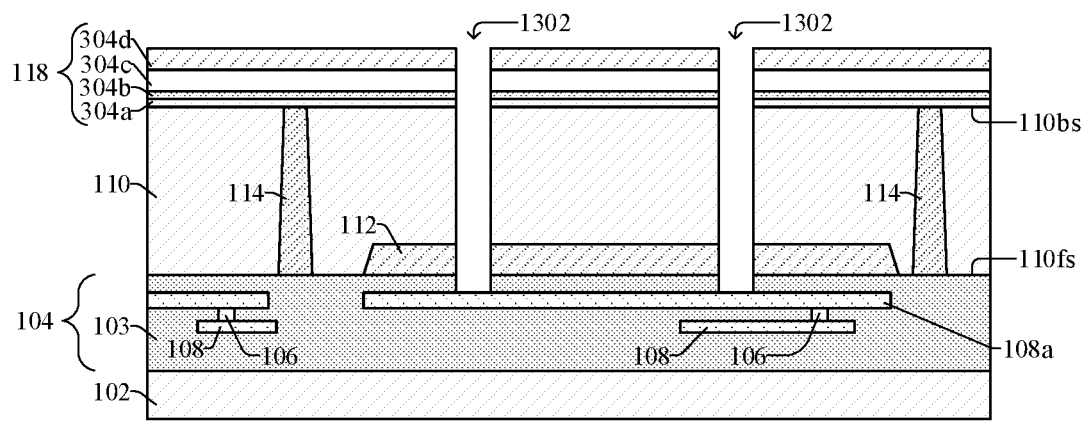

As shown in cross-sectional view 1600 of FIG. 16, a second etch process is performed on the STI structure 112, the interconnect dielectric structure 103, and the dielectric protection layer (1202). This expands the plug openings 1302 and exposes an upper surface of an upper conductive wire layer 108*a*. In some embodiments, the second etch process may include performing a wet etch process, a dry etch process, or another suitable etch process. In some embodiments, the second etch process may include performing a blanket dry etch process on the structure of FIG. 15. In such embodiments, the dielectric protection layer (1202) may be removed by the blanket dry etch process and/or the thickness of the fourth dielectric layer 304*d* may, for example, be about 1,300 Angstroms after performing the second etch process.

Figure 17:
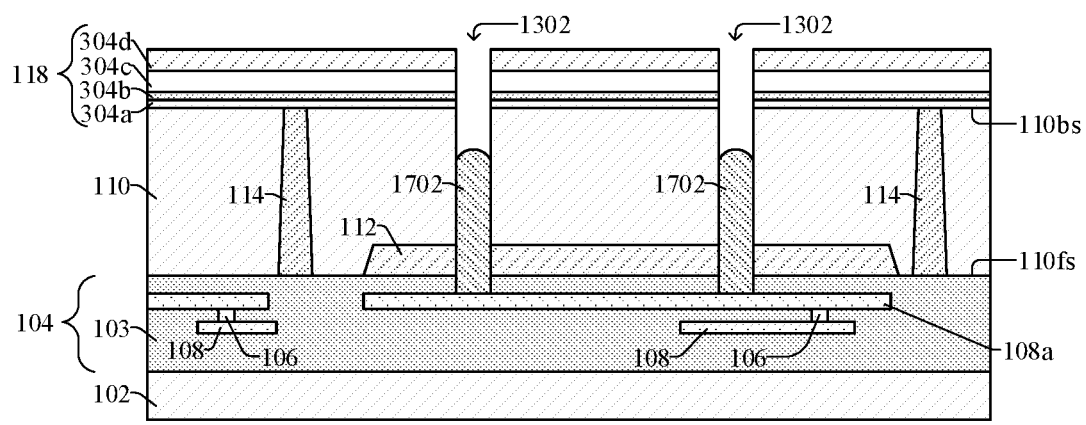

As shown in cross-sectional view 1700 of FIG. 17, plug structures 1702 are formed within at least a portion of the plug openings 1302. In some embodiments, an upper surface of the plug structures 1702 is disposed below the back-side 110*bs* of the semiconductor substrate 110. In some embodiments, a process for forming the plug structures 1702 includes: forming a plug material within the plug openings 1302; and performing an etch back process (e.g., a dry etch process, a wet etch process, etc.) to remove at least a portion of the plug material, thereby defining the plug structures 1702.

Figure 18:
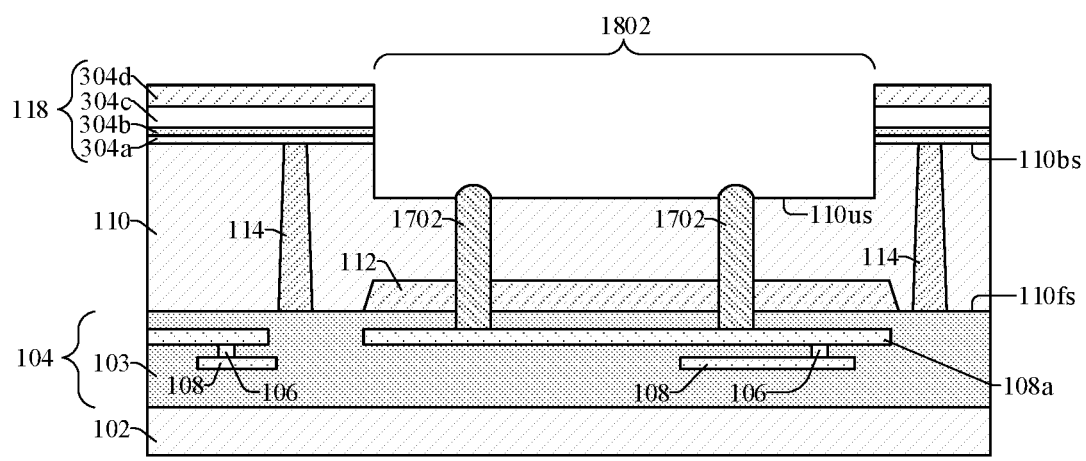

As shown in cross-sectional view 1800 of FIG. 18, a third etch process is performed on the dielectric structure 118 and the semiconductor substrate 110, thereby defining a bond pad opening 1802. The third etch process defines an upper surface 110*us* of the semiconductor substrate 110, wherein the upper surface 110*us* of the semiconductor substrate 110 is below the upper surface of the plug structures 1702. In some embodiments, the third etch process may include performing a wet etch process, a dry etch process, or another suitable etch process. In some embodiments, the third etch process includes: forming a masking layer (not shown) over the dielectric structure 118; exposing unmasked regions of the dielectric structure 118 and the semiconductor substrate 110 to one or more etchants, thereby defining the bond pad opening 1802; and performing a removal process to remove the masking layer.

Figure 19:
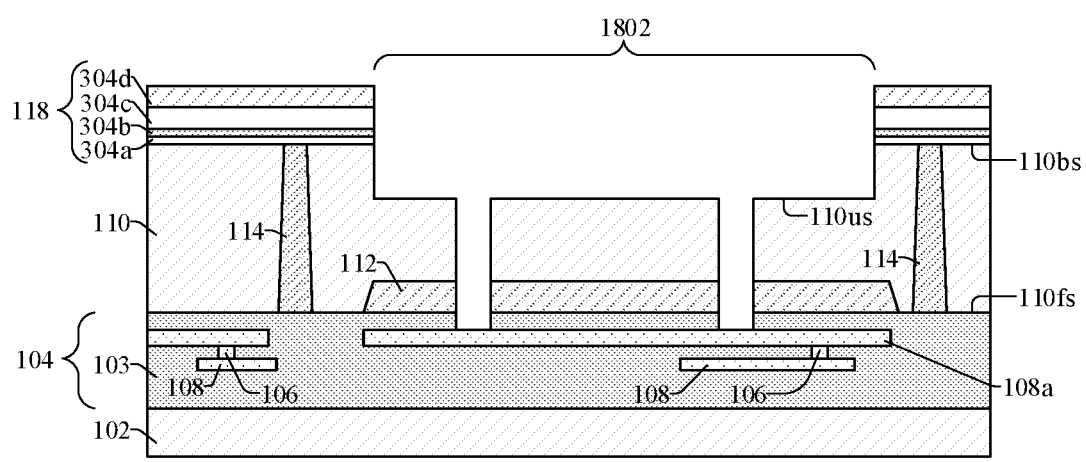

As shown in cross-sectional view 1900 of FIG. 19, a plug removal process is performed to remove the plug structures 1702, thereby expanding the bond pad opening 1802 and exposing the upper surface of the upper conductive wire layer 108*a*. In some embodiments, the plug removal process includes performing a wet ash process and/or a dry ash process, then performing a wet etch process.

Figure 20:
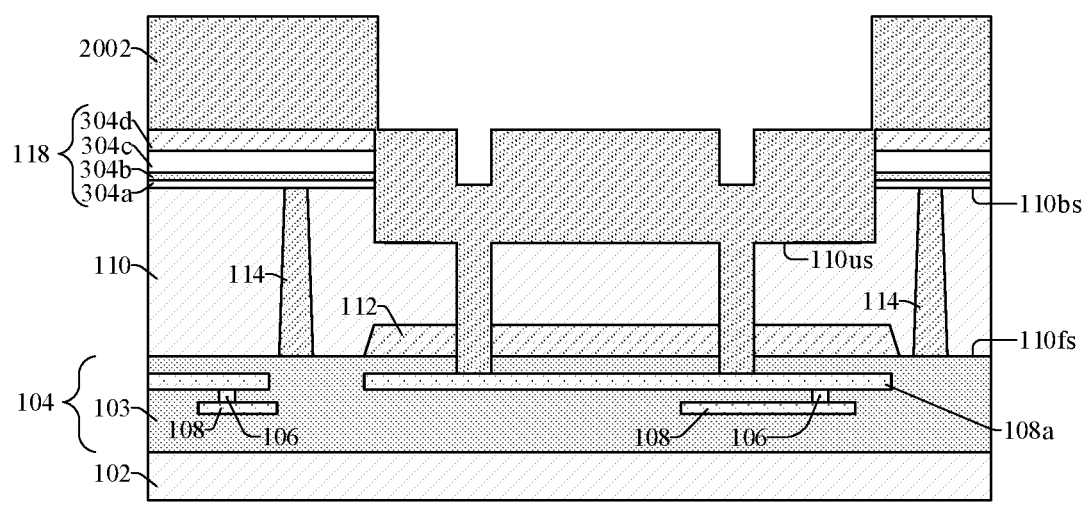

As shown in cross-sectional view 2000 of FIG. 20, a bond pad layer 2002 is formed over the structure of FIG. 19. In some embodiments, the bond pad layer 2002 may, for example, be deposited and/or grown by electroless plating, electroplating, sputtering, or another suitable deposition process. In further embodiments, the bond pad layer 2002 may, for example, be or comprise aluminum, copper, aluminum copper, or the like. In some embodiments, the bond pad layer 2002 may comprise a same material as the conductive vias 106 and/or the conductive wires 108.

Figure 21:
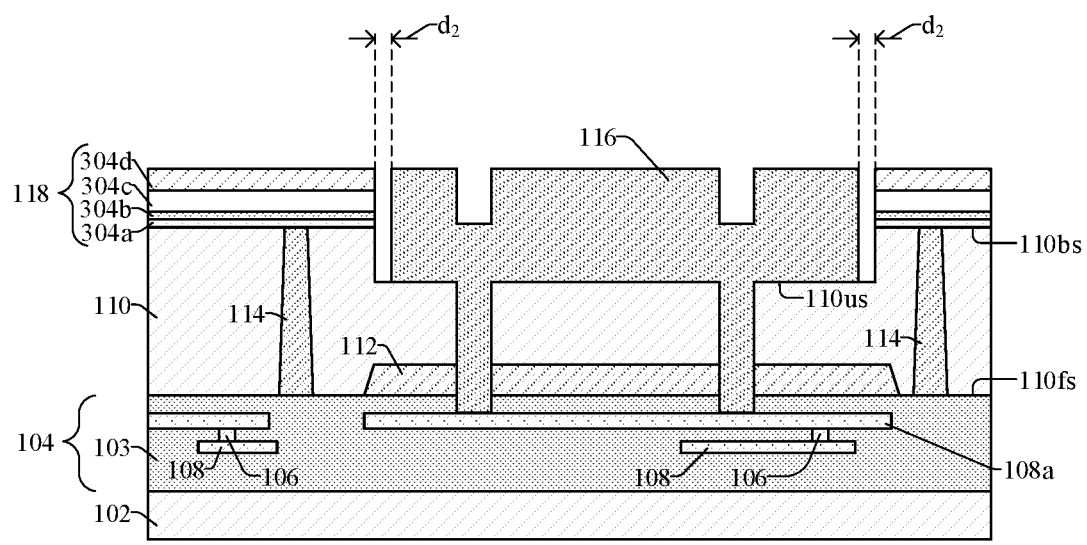

As shown in cross-sectional view 2100 of FIG. 21, a fourth etch process is performed on the bond pad layer (2002 of FIG. 20), thereby defining a bond pad 116. The bond pad 116 is laterally offset from sidewalls of the semiconductor substrate 110 and the dielectric structure 118 by a distance $d_2$. In some embodiments, the distance $d_2$ is non-zero. In further embodiments, the fourth etch process includes: forming a masking layer (not shown) over the bond pad layer (2002 of FIG. 20); exposing unmasked regions of the bond pad layer (2002 of FIG. 20) to one or more etchants, thereby defining the bond pad 116; and performing a removal process to remove the masking layer.

Although FIGS. 9-13 describe forming the bond pad isolation structure 114 before forming the interconnect structure 104 on the front-side 110fs of the semiconductor substrate 110, it will be appreciated that formation of the bond pad isolation structure 114 is not limited to such fabrication methods. For example, in some embodiments, the bond pad isolation structure 114 may be formed after forming the interconnect structure 104, wherein the bond pad isolation structure 114 extends into an upper surface of the interconnect dielectric structure 103 (e.g., see the integrated chip 600 of FIG. 6A). In such embodiments, the bond pad isolation structure 114 may, for example, be formed after the thinning process of FIG. 13 but before formation of the dielectric structure 118. In yet further embodiments, the bond pad isolation structure 114 may, for example, be formed after forming the bond pad 116. In such embodiments, the bond pad isolation structure 114 extends through the dielectric structure 118 to the front-side 110fs of the semiconductor substrate 110 (not shown).

Figure 22:
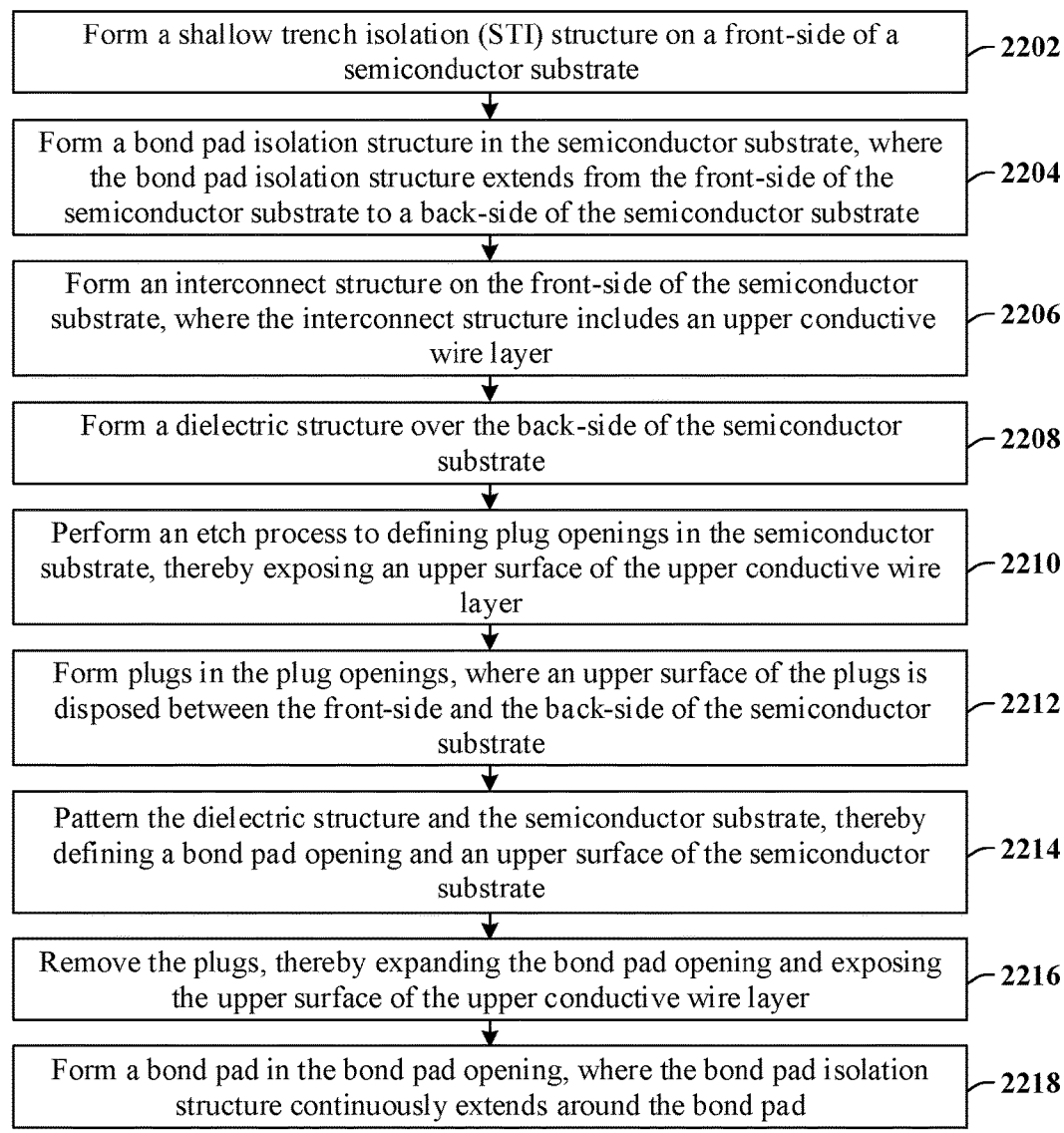
FIG. 22 illustrates a block diagram of some embodiments of the first method of FIGS. 9-21.

FIG. 22 illustrates a first method 2200 of forming an integrated circuit according to the present disclosure. Although the first method 2200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, a shallow trench isolation (STI) structure is formed on a front-side of a semiconductor substrate. FIG. 9 illustrates a cross-sectional view 900 corresponding to some embodiments of act 2202.

At act 2204, a bond pad isolation structure is formed in the semiconductor substrate. The bond pad isolation structure extends from the front-side of the semiconductor substrate to a back-side of the semiconductor substrate. FIGS. 10 and 11 illustrate cross-sectional views 1000 and 1100 corresponding to some embodiments of act 2204.

At act 2206, an interconnect structure is formed on the front-side of the semiconductor substrate. The interconnect structure includes an upper conductive wire layer. FIG. 12 illustrates a cross-sectional view 1200 corresponding to some embodiments of act 2206.

At act 2208, a dielectric structure is formed over the back-side of the semiconductor substrate. FIG. 14 illustrates a cross-sectional view 1400 corresponding to some embodiments of act 2208.

At act 2210, an etch process is performed to define plug openings in the semiconductor substrate, thereby exposing an upper surface of the upper conductive wire layer. FIGS. 15 and 16 illustrate cross-sectional views 1500 and 1600 corresponding to some embodiments of act 2210.

At act 2212, plugs are formed in the plug openings. An upper surface of the plugs is disposed between the front-side and the back-side of the semiconductor substrate. FIG. 17 illustrates a cross-sectional view 1700 corresponding to some embodiments of act 2212.

At act 2214, the dielectric structure and the semiconductor substrate are patterned, thereby defining a bond pad opening and an upper surface of the semiconductor substrate. FIG. 18 illustrates a cross-sectional view 1800 corresponding to some embodiments of act 2214.

At act 2216, the plugs are removed, thereby expanding the bond pad opening and exposing the upper surface of the upper conductive wire layer. FIG. 19 illustrates a cross-sectional view 1900 corresponding to some embodiments of act 2216.

At act 2218, a bond pad is formed in the bond pad openings. The bond pad isolation structure continuously extends around the bond pad. FIGS. 20 and 21 illustrate cross-sectional views 2000 and 2100 corresponding to some embodiments of act 2218.

FIGS. 23-30 illustrate cross-sectional views 2300-3000 of some embodiments of a second method of forming an integrated chip including a bond pad isolation structure surrounding a bond pad according to aspects of the present disclosure. Although the cross-sectional views 2300-3000 shown in FIGS. 23-30 are described with reference to a second method, it will be appreciated that the structures shown in FIGS. 23-30 are not limited to the method but rather may stand alone separate of the method. Although FIGS. 23-30 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 23:
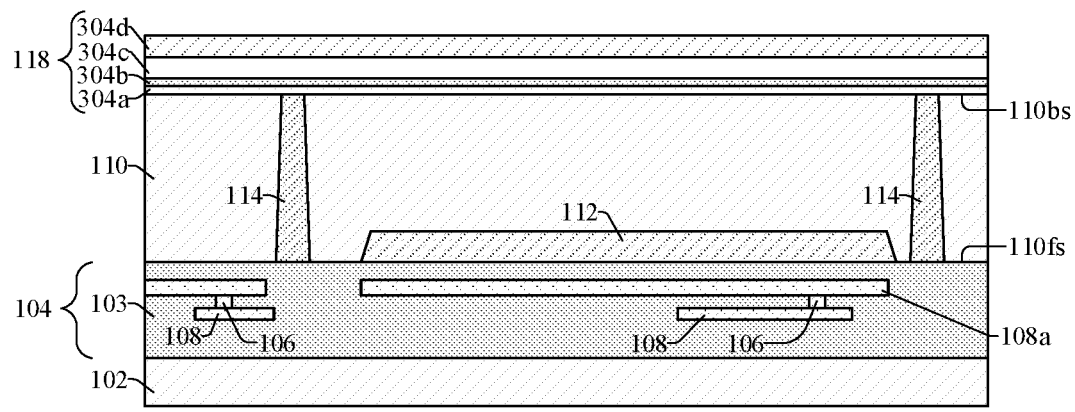
FIGS. 23-30 illustrate a series of cross-sectional views of some embodiments of a second method for forming a bond pad isolation structure surrounding a bond pad.

As shown in cross-sectional view 2300 of FIG. 23, the dielectric structure 118 is formed over the semiconductor substrate 110. In some embodiments, the structure of FIG. 23 is formed as illustrated and/or described in FIGS. 9-14.

Figure 24:
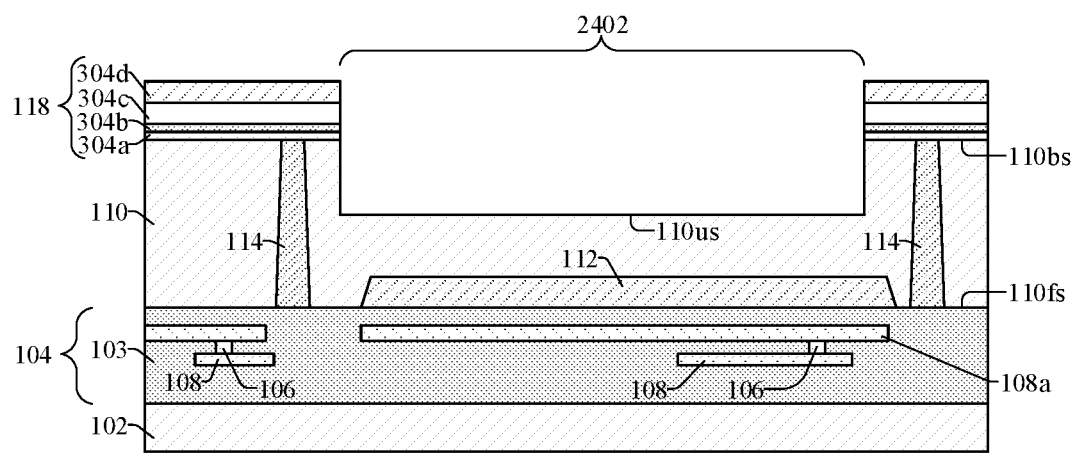

As shown in cross-sectional view 2400 of FIG. 24, a first etch process is performed on the dielectric structure 118 and the semiconductor substrate 110, thereby forming a bond pad opening 2402. In some embodiments, the first etch process may, for example, be or comprise a dry etch process, a wet etch process, or another suitable etch process. In some embodiments, the first etch process includes: forming a masking layer (not shown) over the dielectric structure 118; exposing unmasked regions of the dielectric structure 118 and the semiconductor substrate 110 to one or more etchants, thereby defining the bond pad opening 2402; and performing a removal process to remove the masking layer. In some embodiments, the first etch process defines an upper surface 110us of the semiconductor substrate 110 disposed below the back-side 110bs of the semiconductor substrate 110.

Figure 25:
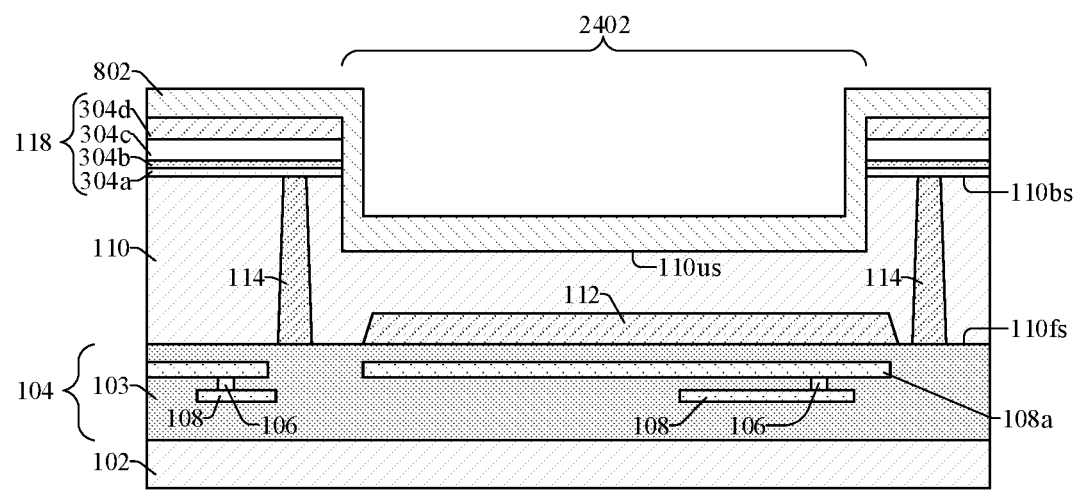

As shown in cross-sectional view 2500 of FIG. 25, a first insulator layer 802 is formed over the dielectric structure 118 and the semiconductor substrate 110, wherein the first insulator layer 802 lines at least a portion of the bond pad opening 2402. In some embodiments, the first insulator layer 802 may, for example, be or comprise an oxide, such as silicon oxide, or another suitable oxide and/or has a thickness of about 4,500 Angstroms. In further embodiments, the thickness of the first insulator layer 802 is sufficiently large (e.g., about 4,500 Angstroms), such that a thickness of the fourth dielectric layer 304d is not reduced during subsequent processing steps (e.g., the third etch process of FIG. 28).

Figure 26:
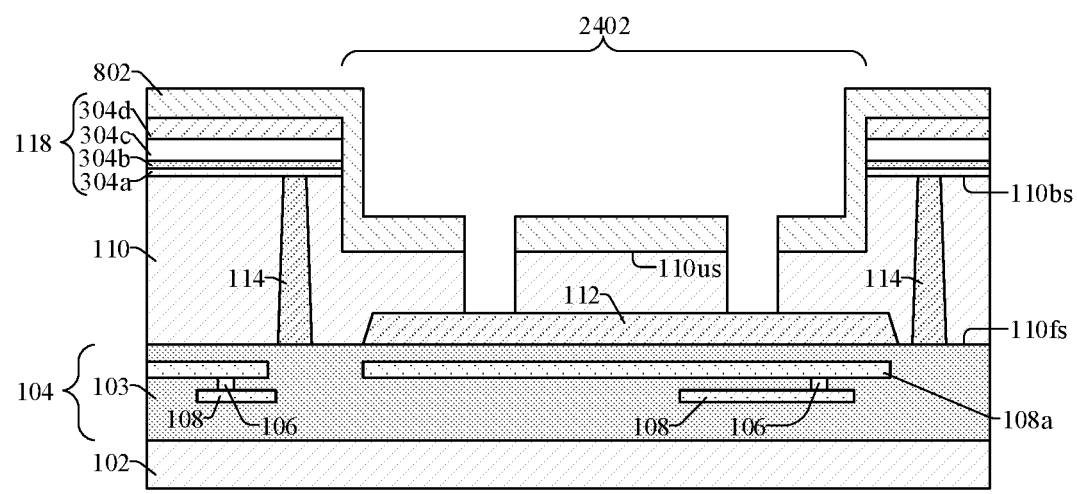

As shown in cross-sectional view 2600 of FIG. 26, a second etch process is performed on the first insulator layer 802 and the semiconductor substrate 110, thereby expanding the bond pad opening 2402 and exposing an upper surface of the STI structure 112. In some embodiments, the second etch process includes: forming a masking layer (not shown) over the first insulator layer 802; exposing unmasked regions of the first insulator layer 802 and the semiconductor substrate 110 to one or more etchants, thereby exposing the upper surface of the STI structure 112; and performing a removal process to remove the masking layer.

Figure 27:
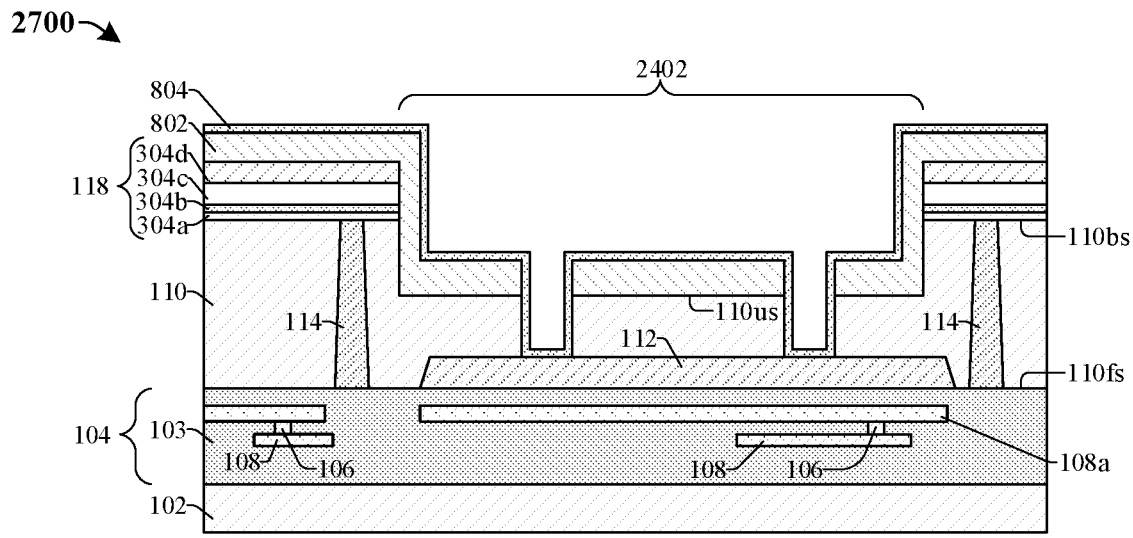

As shown in cross-sectional view 2700 of FIG. 27, a second insulator layer 804 is formed over the first insulator layer 802 and the semiconductor substrate 110. The second insulator layer 804 lines the bond pad opening 2402. In some embodiments, the second insulator layer 804 may, for example, be formed by PVD, CVD, or another suitable deposition process. In some embodiments, the second insulator layer 804 may, for example, be or comprise an oxide, such as silicon oxide, or another suitable oxide.

Figure 28:
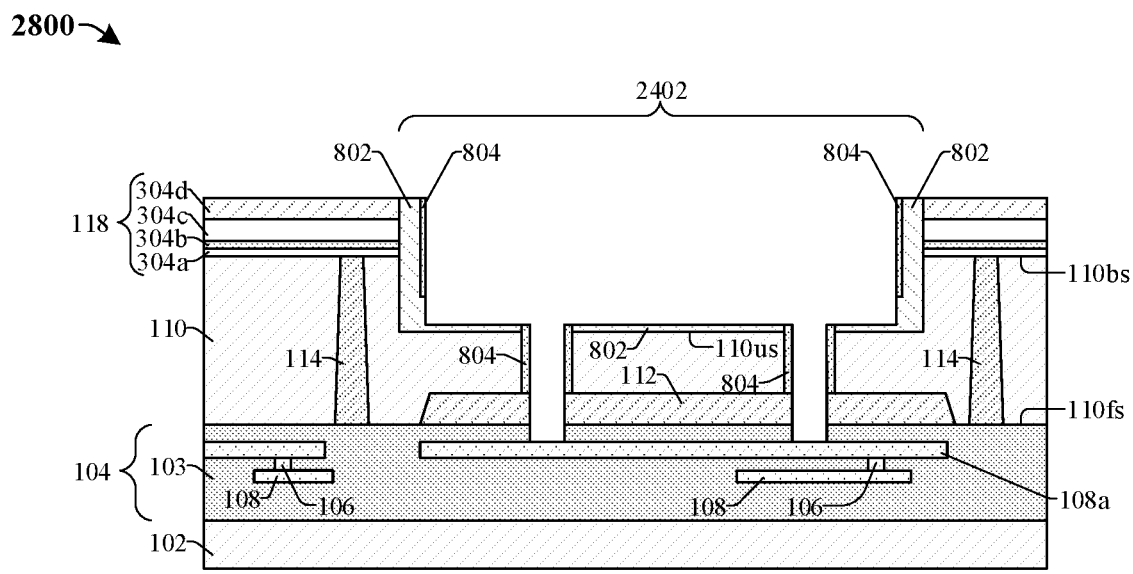

As shown in cross-sectional view 2800 of FIG. 28, a third etch process is performed on the first and second insulator layers 802, 804, the STI structure 112, and the interconnect dielectric structure 103, thereby exposing an upper surface of the upper conductive wire layer 108a. In some embodiments, the third etch process may include performing a wet etch process, a dry etch process, or another suitable etch process. In further embodiments, the third etch process may include performing a blanket dry etch process on the structure of FIG. 27, thereby removing the first insulator layer 802 from an upper surface of the fourth dielectric layer 304d. In such embodiments, a thickness of the fourth dielectric layer 304d after the third etch process may be about 1,300 Angstroms.

Figure 29:
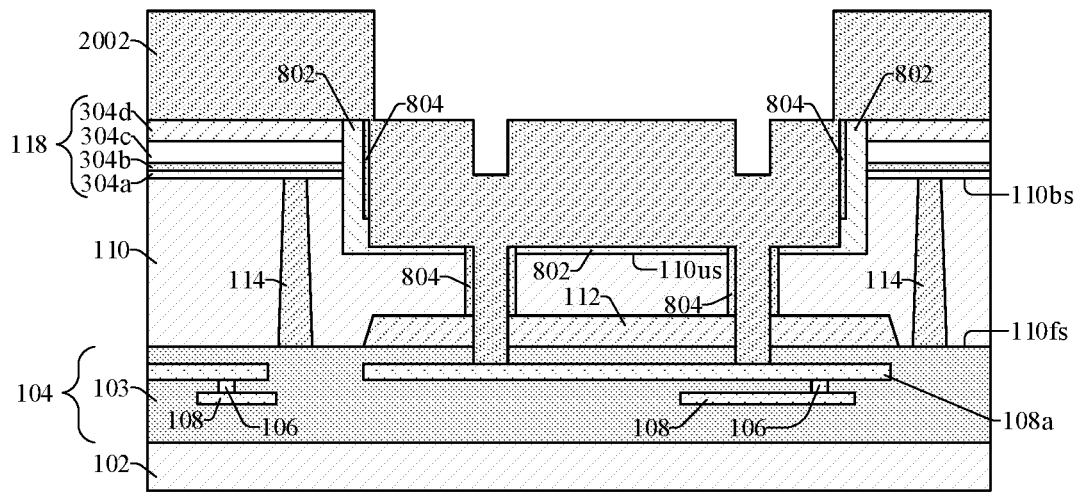

As shown in cross-sectional view 2900 of FIG. 29, a bond pad layer 2002 is formed in the bond pad opening 2402. In some embodiments, the bond pad layer 2002 may, for example, be deposited and/or grown by electroless plating, electroplating, sputtering, or another suitable deposition process. In further embodiments, the bond pad layer 2002 may, for example, be or comprise aluminum, copper, aluminum copper, or the like. In further embodiments, the bond pad layer 2002 may comprise a same material as the conductive vias 106 and/or the conductive wires 108.

Figure 30:
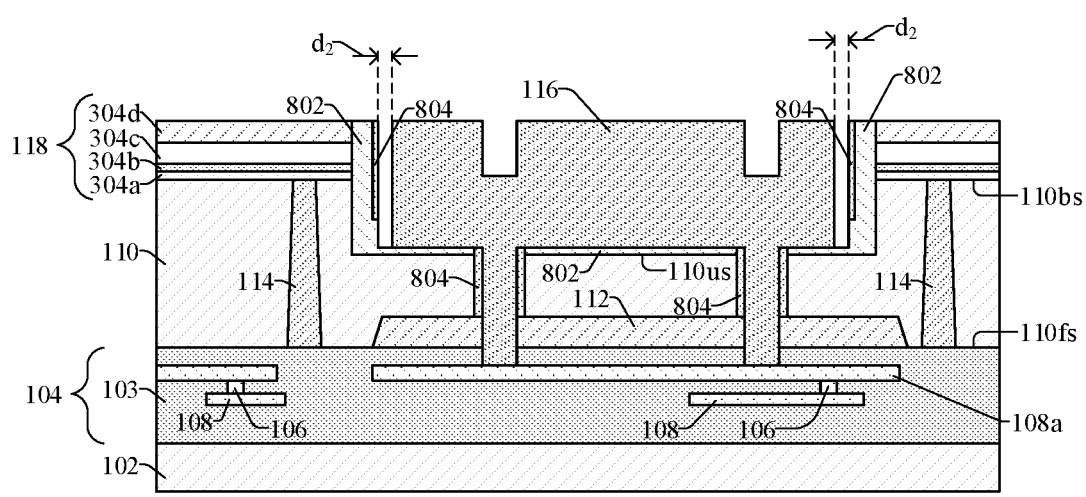

As shown in cross-sectional view 3000 of FIG. 30, a fourth etch process is performed on the bond pad layer (2002 of FIG. 29), thereby defining a bond pad 116. The bond pad 116 is laterally offset from sidewalls of the first and second insulator layers 802, 804 by a distance $d_2$. In some embodiments, the distance $d_2$ is non-zero. In further embodiments, the fourth etch process includes: forming a masking layer (not shown) over the bond pad layer (2002 of FIG. 29); exposing unmasked regions of the bond pad layer (2002 of FIG. 29) to one or more etchants, thereby defining the bond pad 116; and performing a removal process to remove the masking layer.

Figure 31:
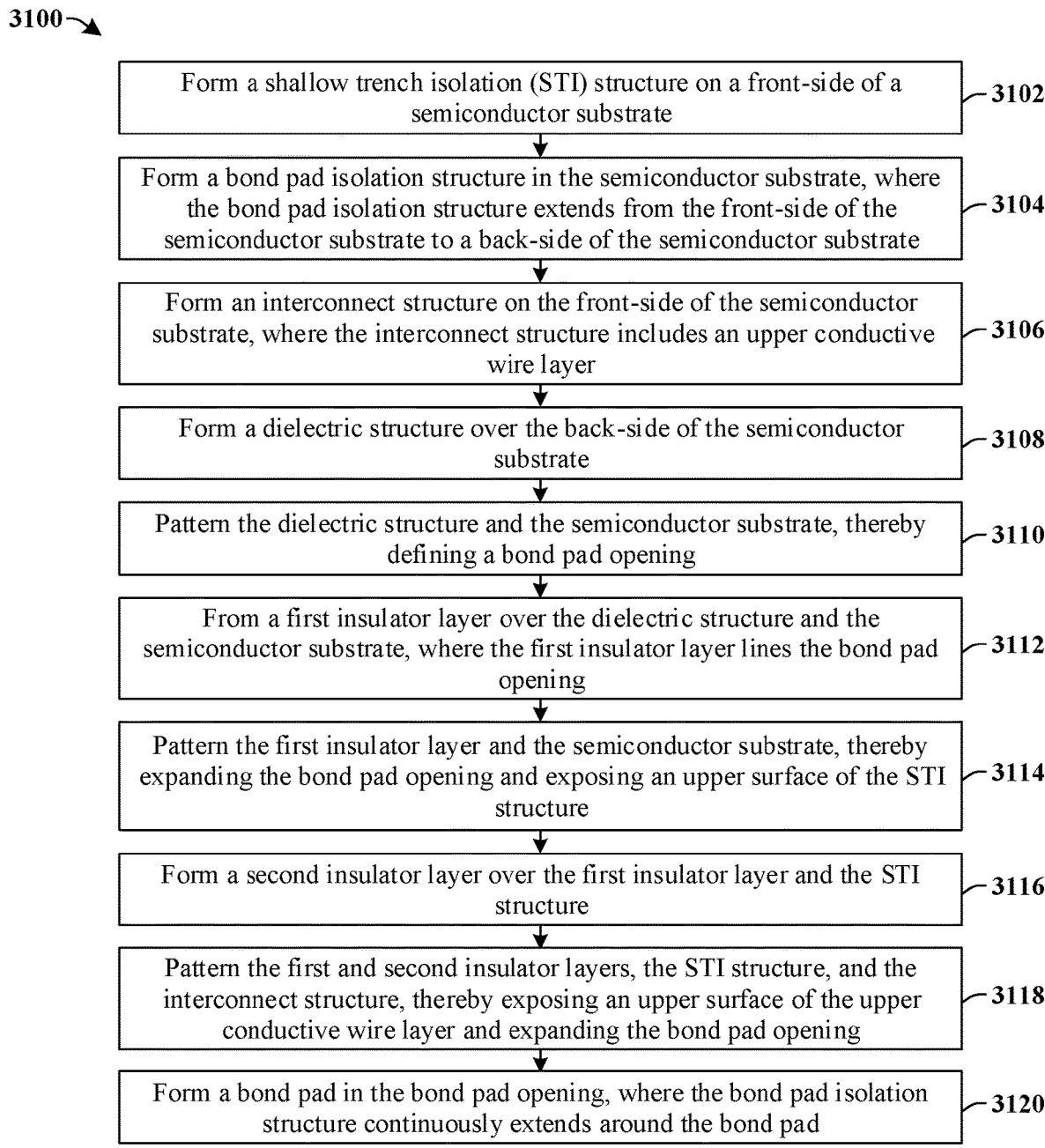
FIG. 31 illustrates a block diagram of some embodiments of the second method of FIGS. 23-30.

FIG. 31 illustrates a second method 3100 of forming an integrated circuit according to the present disclosure. Although the second method 3100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 3102, a shallow trench isolation (STI) structure is formed on a front-side of a semiconductor substrate. FIG. 9 illustrates a cross-sectional view 900 corresponding to some embodiments of act 3102.

At act 3104, a bond pad isolation structure is formed in the semiconductor substrate. The bond pad isolation structure extends from the front-side of the semiconductor substrate to a back-side of the semiconductor substrate. FIGS. 10 and 11 illustrate cross-sectional views 1000 and 1100 corresponding to some embodiments of act 3104.

At act 3106, an interconnect structure is formed on the front-side of the semiconductor substrate. The interconnect structure includes an upper conductive wire layer. FIG. 12 illustrates a cross-sectional view 1200 corresponding to some embodiments of act 3106.

At act 3108, a dielectric structure is formed over the back-side of the semiconductor substrate. FIG. 14 illustrates a cross-sectional view 1400 corresponding to some embodiments of act 3108.

At act 3110, the dielectric structure and the semiconductor substrate are patterned, thereby defining a bond pad opening. FIG. 24 illustrates a cross-sectional view 2400 corresponding to some embodiments of act 3110.

At act 3112, a first insulator layer is formed over the dielectric structure and the semiconductor substrate. The first insulator layer lines the bond pad opening. FIG. 25 illustrates a cross-sectional view 2500 corresponding to some embodiments of act 3112.

At act 3114, the first insulator layer and the semiconductor substrate are patterned, thereby expanding the bond pad opening and exposing an upper surface of the STI structure. FIG. 26 illustrates a cross-sectional view 2600 corresponding to some embodiments of act 3114.

At act 3116, a second insulator layer is formed over the first insulator layer and the STI structure. FIG. 27 illustrates a cross-sectional view 2700 corresponding to some embodiments of act 3116.

At act 3118, the first and second insulator layers, the STI structure, and the interconnect structure are patterned, thereby exposing an upper surface of the upper conductive wire layer and expanding the bond pad opening. FIG. 28 illustrates a cross-sectional view 2800 corresponding to some embodiments of act 3118.

At act 3120, a bond pad is formed in the bond pad opening. The bond pad isolation structure continuously extends around the bond pad. FIGS. 29 and 30 illustrate cross-sectional views 2900 and 3000 corresponding to some embodiments of act 3120.

FIGS. 32-38 illustrate cross-sectional views 3200-3800 of some embodiments of a third method of forming an integrated chip including a bond pad isolation structure surrounding a bond pad according to aspects of the present disclosure. Although the cross-sectional views 3200-3800 shown in FIGS. 32-38 are described with reference to a third method, it will be appreciated that the structures shown in FIGS. 32-38 are not limited to the method but rather may stand alone separate of the method. Although FIGS. 32-38 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 32:
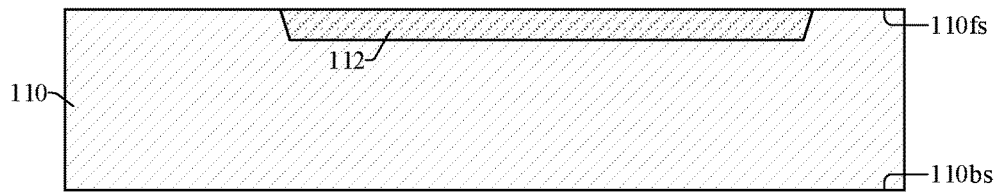
FIGS. 32-38 illustrates a series of cross-sectional views of some embodiments of a third method for forming a bond pad isolation structure surrounding a bond pad.

As shown in cross-sectional view 3200 of FIG. 32, the shallow trench isolation (STI) structure 112 is formed on the front-side 110fs of the semiconductor substrate 110. In some embodiments, the STI structure 112 of FIG. 32 is formed as illustrated and/or described in FIGS. 9-11.

Figure 33:
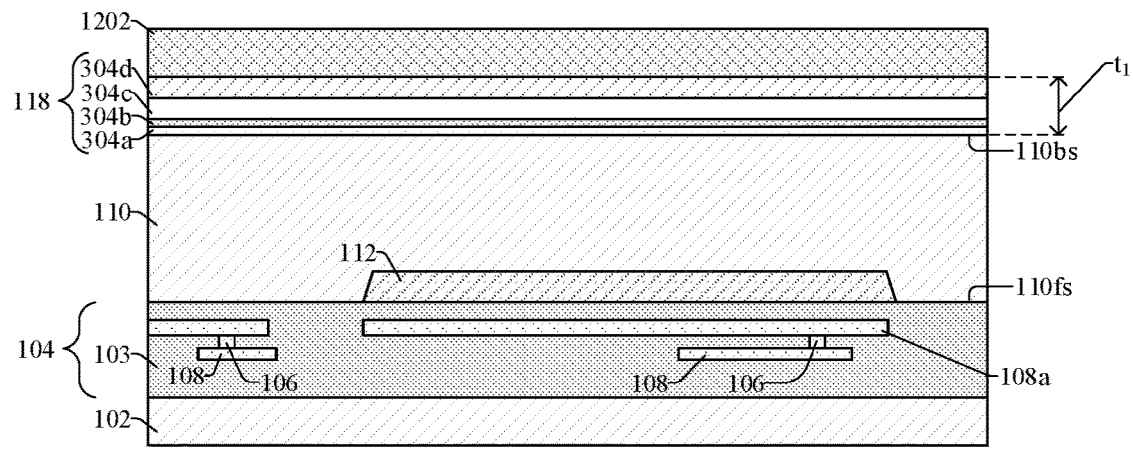

As shown in cross-sectional view 3300 of FIG. 33, an interconnect structure 104 is formed on the front-side 110fs of the semiconductor substrate 110. The interconnect structure 104 is bonded to a carrier substrate 102, and a dielectric structure 118 is formed over the back-side 110bs of the semiconductor substrate 110. Further, a dielectric protection layer 1202 is formed over the dielectric structure 118. In some embodiments, the structure of FIG. 33 is formed as illustrated and/or described in FIGS. 12-14.

Figure 34:
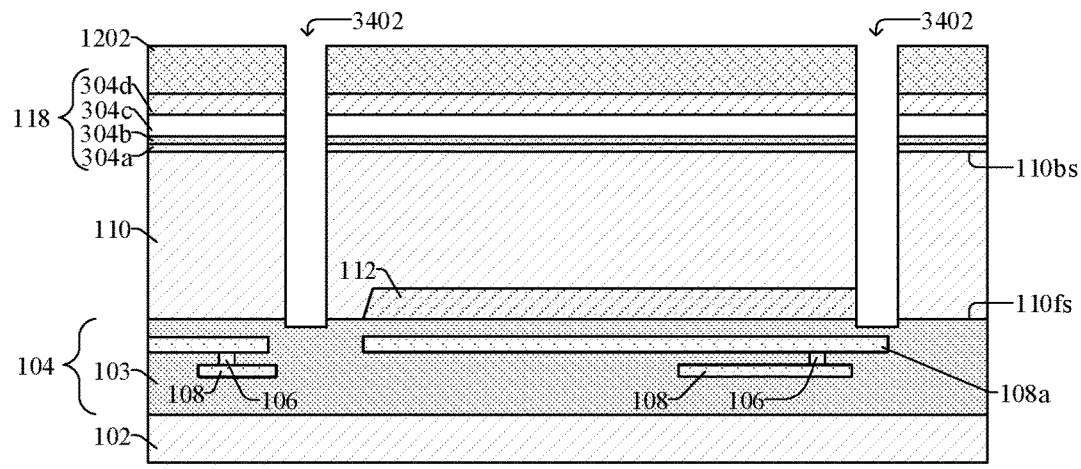

As shown in cross-sectional view 3400 of FIG. 34, an etch process is performed on the dielectric protection layer 1202, the dielectric structure 118, and the semiconductor substrate 110, thereby forming bond pad isolation openings 3402. In some embodiments, the etch process may remove at least a portion of the interconnect dielectric structure 103. In some embodiments, the etch process may include performing a wet etch process, a dry etch process, or another suitable etch process. In some embodiments, the etch process includes: forming a masking layer (not shown) over the dielectric protection layer 1202; exposing unmasked regions of the dielectric protection layer 1202 and underlying layers to one or more etchants, thereby defining the bond pad isolation openings 3402; and performing a removal process to remove the masking layer.

Figure 35:
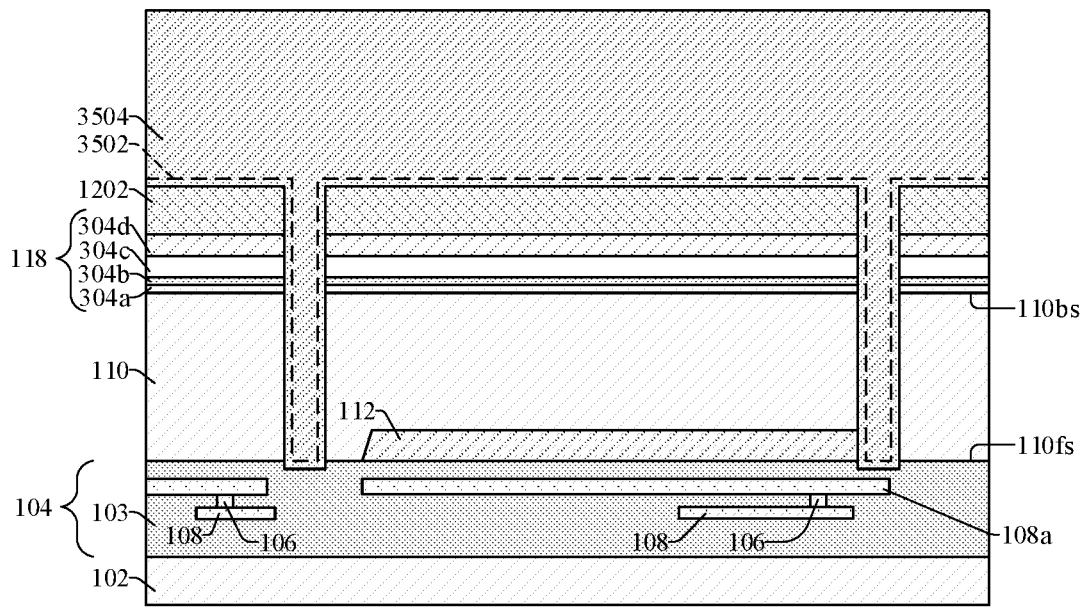

As shown in cross-sectional view 3500 of FIG. 35, a first DTI layer 3502 and a second DTI layer 3504 are formed over the dielectric protection layer 1202 and within the bond pad isolation openings (3402 of FIG. 34). In some embodiments, the first DTI layer 3502 is omitted and the second DTI layer 3504 completely fills the bond pad isolation openings (3402 of FIG. 34). In some embodiments, the first DTI layer 3502 may, for example, be or comprise an oxide, such as silicon dioxide, another suitable oxide, or the like and/or may be formed to a thickness of about 15,000 Angstroms. In further embodiments, the second DTI layer 3504 may, for example, be or comprise silicon oxynitride, another suitable dielectric material, or the like and/or may be formed to a thickness of about 700 Angstroms.

Figure 36:
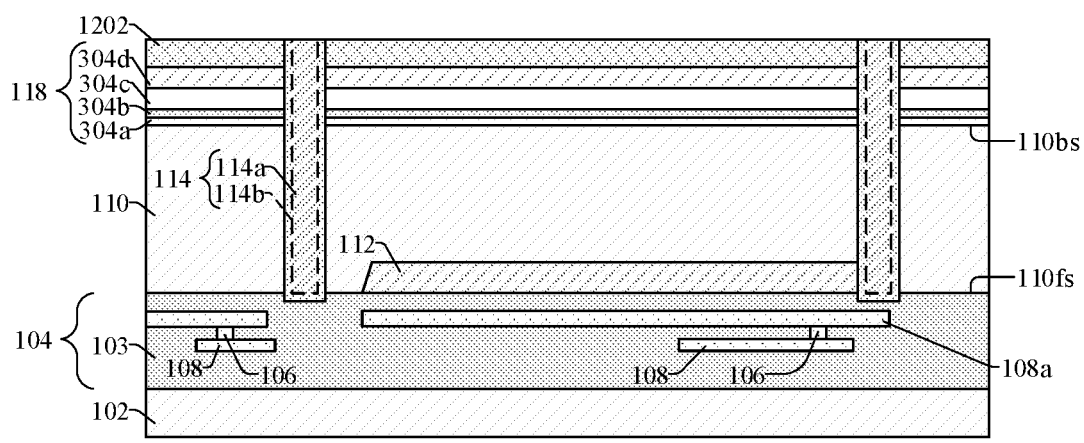

As shown in cross-sectional view 3600 of FIG. 36, a planarization process is performed on the first and/or second DTI layers (3502, 3504 of FIG. 35) thereby defining a bond pad isolation structure 114. The bond pad isolation structure 114 may comprise a first bond pad isolation layer 114a and/or a second bond pad isolation layer 114b. In some embodiments, the planarization process includes performing a chemical-mechanical planarization (CMP) on the first and second DTI layers (3502, 3504 of FIG. 35) and the dielectric protection layer 1202. In further embodiments, the planarization process may reduce a thickness of the dielectric protection layer 1202.

Figure 37:
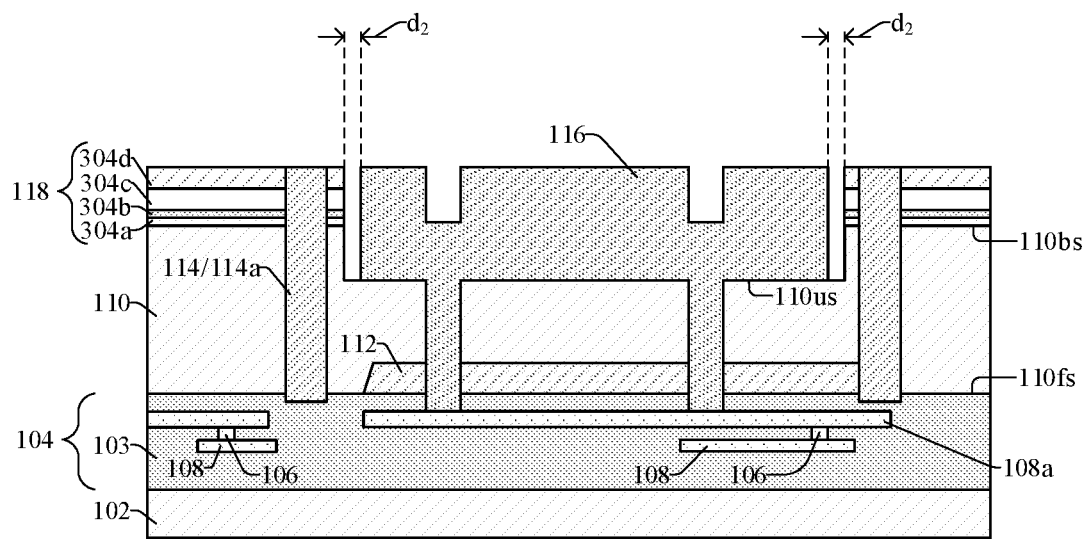

As shown in cross-sectional view 3700 of FIG. 37, a bond pad 116 is formed in the semiconductor substrate 110 and is continuously surrounded by the bond pad isolation structure 114. In some embodiments, the structure of FIG. 37 is formed as illustrated and/or described in FIGS. 15-21. In further embodiments, the bond pad 116 is formed as illustrated and/or described in FIGS. 24-30. The structure of FIG. 37 may be formed by omitting the first DTI layer (3502 of FIG. 35), in which the bond pad isolation structure 114 comprises the first bond pad isolation layer 114a. In some embodiments, the first bond pad isolation layer 114a may, for example, be or comprise silicon dioxide, another suitable oxide, or the like.

Figure 38:
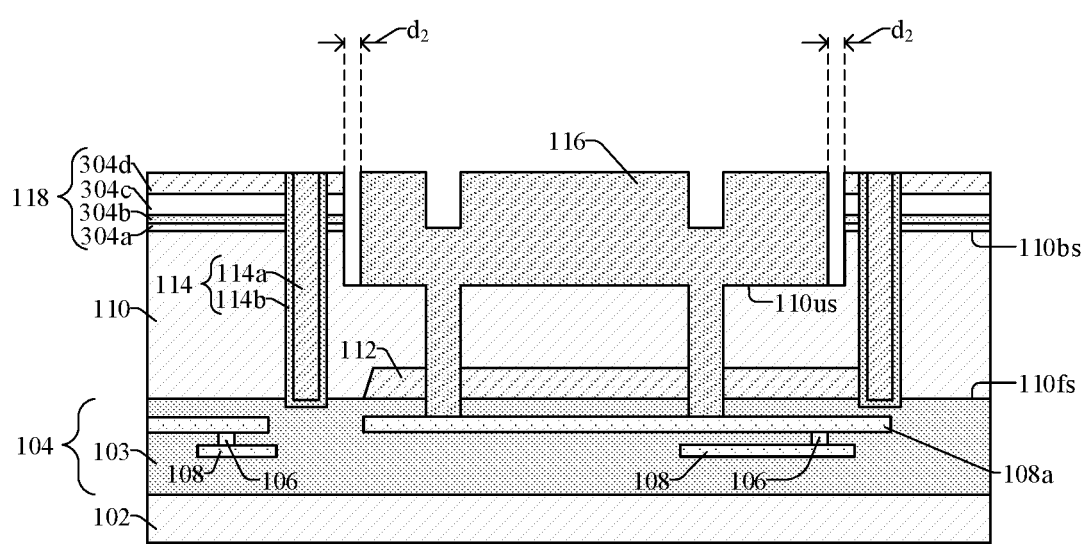

As shown in cross-sectional view 3800 of FIG. 38, a bond pad 116 is formed in the semiconductor substrate 110 and is continuously surrounded by the bond pad isolation structure 114. In some embodiments, the structure of FIG. 38 is formed as illustrated and/or described in FIGS. 15-21. In further embodiments, the bond pad 116 is formed as illustrated and/or described in FIGS. 24-30. The bond pad isolation structure 114 comprises the first bond pad isolation layer 114a and the second bond pad isolation layer 114b. In some embodiments, the first bond pad isolation layer 114a may, for example, be or comprise silicon dioxide, another suitable oxide, or the like. In further embodiments, the second bond pad isolation layer 114b may, for example, be or comprise silicon oxynitride, another suitable dielectric material, or the like.

Figure 39:
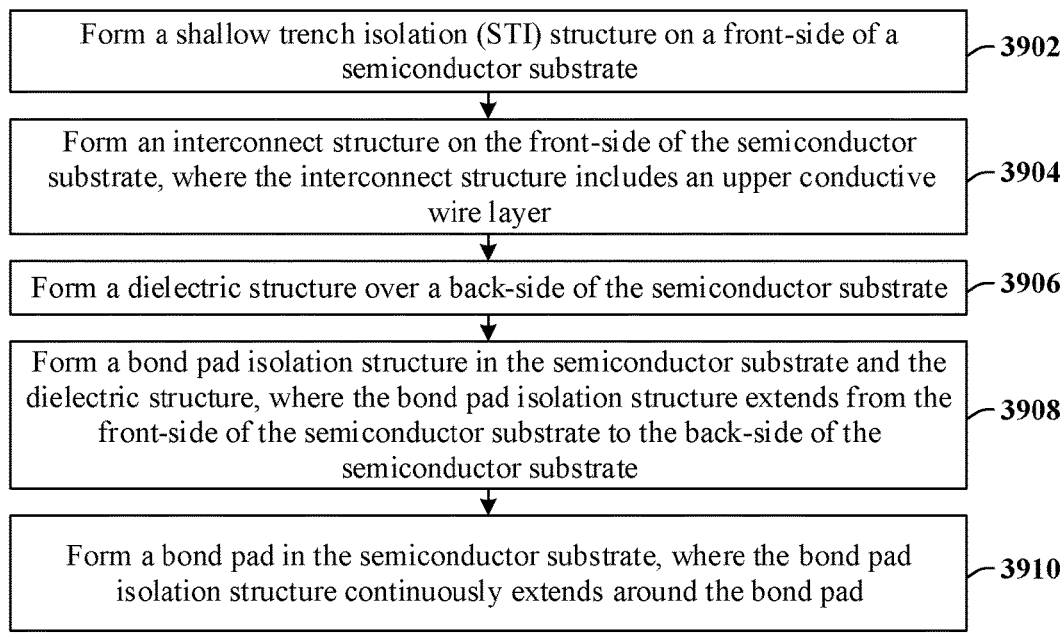
FIG. 39 illustrates a block diagram of some embodiments of the third method of FIGS. 32-38.

FIG. 39 illustrates a third method 3900 of forming an integrated circuit according to the present disclosure. Although the third method 3900 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 3902, a shallow trench isolation (STI) structure is formed on a front-side of a semiconductor substrate. FIG. 32 illustrates a cross-sectional view 3200 corresponding to some embodiments of act 3902.

At act 3904, an interconnect structure is formed on the front-side of the semiconductor substrate. The interconnect structure includes an upper conductive wire layer. FIG. 33 illustrates a cross-sectional view 3300 corresponding to some embodiments of act 3904.

At act 3906, a dielectric structure is formed over the back-side of the semiconductor substrate. FIG. 33 illustrates a cross-sectional view 3300 corresponding to some embodiments of act 3906.

At act 3908, a bond pad isolation structure is formed in the semiconductor substrate and the dielectric structure. The bond pad isolation structure extends from the front-side of the semiconductor substrate to the back-side of the semiconductor substrate. FIGS. 35 and 36 illustrate cross-sectional views 3500 and 3600 corresponding to some embodiments of act 3908.

At act 3910, a bond pad is formed in the semiconductor substrate. The bond pad isolation structure continuously extends around the bond pad. FIGS. 37 and 38 illustrate cross-sectional views 3700 and 3800 corresponding to some embodiments of act 3910.

Accordingly, in some embodiments, the present disclosure relates to a bond pad region laterally offset from a device region. The bond pad region includes a bond pad extending through a semiconductor substrate to an interconnect structure. A bond pad isolation structure is disposed within the semiconductor substrate and continuously surrounds outer sidewalls of the bond pad.

In some embodiments, the present application provides a semiconductor device structure including a semiconductor substrate having a back-side surface and a front-side surface opposite the back-side surface; a bond pad extending through the semiconductor substrate; and a bond pad isolation structure disposed within the semiconductor substrate, wherein the bond pad isolation structure extends from the front-side surface to the back-side surface of the semiconductor substrate, and wherein the bond pad isolation structure continuously extends around the bond pad.

In some embodiments, the present application provides a semiconductor device structure including a semiconductor substrate overlying a carrier substrate, wherein photodetectors are disposed in the semiconductor substrate; an interconnect structure disposed between the semiconductor substrate and the carrier substrate, wherein an upper conductive wire layer is disposed in the interconnect structure; a bond pad extending through the semiconductor substrate to the interconnect structure, wherein the bond pad contacts the upper conductive wire layer and has a top surface disposed above the semiconductor substrate, wherein the bond pad is laterally offset from the photodetectors; and a bond pad isolation structure disposed within the semiconductor substrate, wherein the bond pad isolation structure continuously wraps around outer sidewalls of the bond pad.

In some embodiments, the present application provides a method for forming a semiconductor device structure, the method includes forming a bond pad isolation structure in a semiconductor substrate, wherein the bond pad isolation structure extends from a front-side surface to a back-side surface of the semiconductor substrate; forming an interconnect structure on the front-side surface of the semiconductor substrate, wherein the interconnect structure includes a conductive wire layer; patterning the front-side surface of the semiconductor substrate to define a bond pad opening and expose an upper surface of the conductive wire layer, wherein the bond pad opening is disposed laterally between inner sidewalls of the bond pad isolation structure; and forming a bond pad in the bond pad opening, wherein the bond pad extends from the semiconductor substrate to the conductive wire layer, and wherein the bond pad isolation structure continuously wraps around the bond pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate having an upper surface vertically below a top surface;
   a dielectric structure contacting the top surface of the substrate;
   a conductive structure disposed in the substrate, wherein the conductive structure comprises an upper conductive body and conductive protrusions directly underlying the upper conductive body, wherein the upper conductive body overlies the upper surface of the substrate, wherein a bottom surface of the dielectric structure is disposed between a top surface and a bottom surface of the upper conductive body;
   a first isolation structure disposed in the substrate on opposing sides of the upper conductive body; and
   a second isolation structure disposed in the substrate and laterally extending between the conductive protrusions, wherein an outer perimeter of the second isolation structure is spaced between inner sidewalls of the first isolation structure.

2. The integrated chip of claim 1, wherein the second isolation structure directly contacts the conductive protrusions.

3. The integrated chip of claim 1, wherein a distance between the upper surface of the substrate and the top surface of the substrate is less than a height of the upper conductive body.

4. The integrated chip of claim 3, wherein a height of the first isolation structure is greater than a height of the conductive protrusions, wherein the height of the conductive protrusions is greater than the distance.

5. The integrated chip of claim 1, further comprising:
   a plurality of photodetectors disposed within the substrate;
   a grid structure overlying the dielectric structure and the plurality of photodetectors, wherein the grid structure comprises a first grid layer vertically stacked with a second grid layer, wherein the first grid layer comprises a first material and the second grid layer comprises a second material different from the first material; and
   a plurality of color filters arranged in the first and second grid layers and over the plurality of photodetectors.

6. The integrated chip of claim 1, wherein when viewed in plan view the first isolation structure is ring-shaped and comprises a curved edge that conforms to a shape of a curved edge of the upper conductive body.

7. The integrated chip of claim 1, wherein the dielectric structure comprises a topmost dielectric layer disposed over one or more lower dielectric layers, wherein the top surface of the upper conductive body is aligned with a top surface of the topmost dielectric layer or is vertically above a bottom surface of the topmost dielectric layer.

8. The integrated chip of claim 1, wherein a top surface of the first isolation structure is disposed between the top and bottom surfaces of the upper conductive body.

9. An integrated chip comprising:
   a substrate having a front-side surface opposite a back-side surface, wherein the substrate comprises opposing sidewalls extending from the back-side surface to an upper surface of the substrate;
   a conductive structure spaced between the opposing sidewalls of the substrate, wherein the conductive structure comprises an upper conductive body, a first conductive protrusion, and second conductive protrusion, wherein the upper conductive body has a bottom surface below the back-side surface and overlying the upper surface of the substrate, wherein the first and second conductive protrusions contact and underlie the upper conductive body, wherein a top surface of the upper conductive body is vertically above the front-side surface;
   a first insulator layer disposed directly between the bottom surface of the upper conductive body and the upper surface of the substrate;
   a second insulator layer disposed between sidewalls of the first and second conductive protrusions and the substrate;
   an isolation structure disposed in the substrate, wherein outer sidewalls of the upper conductive body are spaced between inner sidewalls of the isolation structure;
   a dielectric structure disposed along the back-side surface and over the isolation structure, wherein a top surface of the dielectric structure is aligned with a top surface of the first insulator layer; and a shallow trench isolation (STI) structure between a bottom surface of the second insulator layer and the front-side surface, wherein an outer sidewall of the STI structure is spaced between the inner sidewalls of the isolation structure.

10. The integrated chip of claim 9, wherein a vertical thickness of the dielectric structure is less than a vertical thickness of the upper conductive body.

11. The integrated chip of claim 9, wherein the dielectric structure comprises a first material different from a second material of the isolation structure and different from a third material of the first insulator layer, wherein the first insulator layer contacts opposing sidewalls of the dielectric structure, and wherein outer sidewalls of the first insulator layer are disposed between the inner sidewalls of the isolation structure.

12. The integrated chip of claim 9, wherein the dielectric structure comprises a first dielectric layer, a second dielectric layer, and a third dielectric layer, wherein the first, second, and third dielectric layers comprise different materials, wherein the dielectric structure comprises opposing sidewalls aligned with the opposing sidewalls of the substrate.

13. The integrated chip of claim 9, wherein the second insulator layer directly contacts inner sidewalls of the first insulator layer.

14. The integrated chip of claim 9, wherein a width of the STI structure is less than a distance between the inner sidewalls of the isolation structure.

15. The integrated chip of claim 9, wherein a width of the isolation structure continuously decreases from the back-side surface to the front-side surface.

16. The integrated chip of claim 9, wherein a bottom surface of the STI structure is aligned with a bottom surface of the isolation structure.

17. A method for forming an integrated chip, comprising:
forming an isolation structure in a substrate;
forming a dielectric structure over a first surface of the substrate;
performing a first patterning process on the dielectric structure and the first surface of the substrate to form a plurality of openings extending through the dielectric structure and the substrate;
forming filler structures within the openings, wherein upper surfaces of the filler structures are disposed below the first surface;
performing a second patterning process on the dielectric structure and the substrate to form opposing sidewalls and an upper surface in the substrate;
removing the filler structures; and
forming a conductive structure comprising an upper conductive body over the upper surface of the substrate and conductive protrusions within the openings, wherein the isolation structure is disposed on opposing sides of the upper conductive body.

18. The method of claim 17, wherein the isolation structure is formed before forming the dielectric structure.

19. The method of claim 17, wherein after the second patterning process, the upper surfaces of the filler structures are above the upper surface of the substrate.

20. The method of claim 17, wherein forming the isolation structure comprises:
etching the substrate and the dielectric structure to form isolation openings extending through the dielectric structure and the substrate;
depositing an isolation layer over the dielectric structure and filling the isolation openings; and
performing a planarization process on the isolation layer.

* * * * *